(12) United States Patent (10) Patent No.: US 8,130,626 B2
Kasono (45) Date of Patent: Mar. 6, 2012

(54) RECORDING APPARATUS, RECORDING CONTROL SIGNAL GENERATING APPARATUS, METHOD OF MANUFACTURING IMPRINT MOLD, IMPRINT MOLD, AND MAGNETIC DISC

(75) Inventor: Osamu Kasono, Saitama (JP)

(73) Assignee: Pioneer Corporation, Kanagawa (JP)

( * ) Notice: Subject to any disclaimer, the term of this patent is extended or adjusted under 35 U.S.C. 154(b) by 821 days.

(21) Appl. No.: 12/293,017

(22) PCT Filed: Mar. 15, 2007

(86) PCT No.: PCT/JP2007/055245
§ 371 (c)(1),
(2), (4) Date: Oct. 6, 2008

(87) PCT Pub. No.: WO2007/105799
PCT Pub. Date: Sep. 20, 2007

(65) Prior Publication Data
US 2009/0207395 A1      Aug. 20, 2009

(30) Foreign Application Priority Data

Mar. 15, 2006   (JP) .................................. 2006-070527

(51) Int. Cl.
*G11B 7/00* (2006.01)
*G03C 5/00* (2006.01)
(52) U.S. Cl. .................. 369/126; 369/47.38; 250/492.2

(58) Field of Classification Search .................. 369/126, 369/44.27, 47.36, 47.38, 47.41, 47.46, 47.51; 250/492.2; 430/296; 264/1.33, 2.5
See application file for complete search history.

(56) References Cited

U.S. PATENT DOCUMENTS
6,650,611 B1   11/2003   Kamimura et al.
(Continued)

FOREIGN PATENT DOCUMENTS
JP       63-55935 A       3/1988
(Continued)

*Primary Examiner* — Nabil Hindi
(74) *Attorney, Agent, or Firm* — Young & Thompson

(57) ABSTRACT

Blanking by a blanking control unit is eliminated by making the tangential direction movement velocity of the substrate and the deflection velocity of the beam faster in the segment, in which the recording pattern is sparse, and making and slower in segments, in which it is dense. In this case, in segment in which it is desired to form a recording pattern thicker in the radial direction, a thick recording can be realized by setting the recording velocity by the recording velocity setting means to be slower, and in the case where is substantially constant, setting to be relatively slower, than in the segments.

22 Claims, 23 Drawing Sheets

U.S. PATENT DOCUMENTS 7,938,990 B2 * 5/2011 Soeno .................... 264/1.33

FOREIGN PATENT DOCUMENTS

| JP | 2000-113521 A | 4/2000 |
| JP | 2000-315637 A | 11/2000 |
| JP | 2002-288890 A | 10/2002 |
| JP | 2002-299232 A | 10/2002 |
| JP | 2003-22534 A | 1/2003 |
| JP | 2003-36573 A | 2/2003 |
| JP | 2005-302132 A | 10/2005 |

* cited by examiner

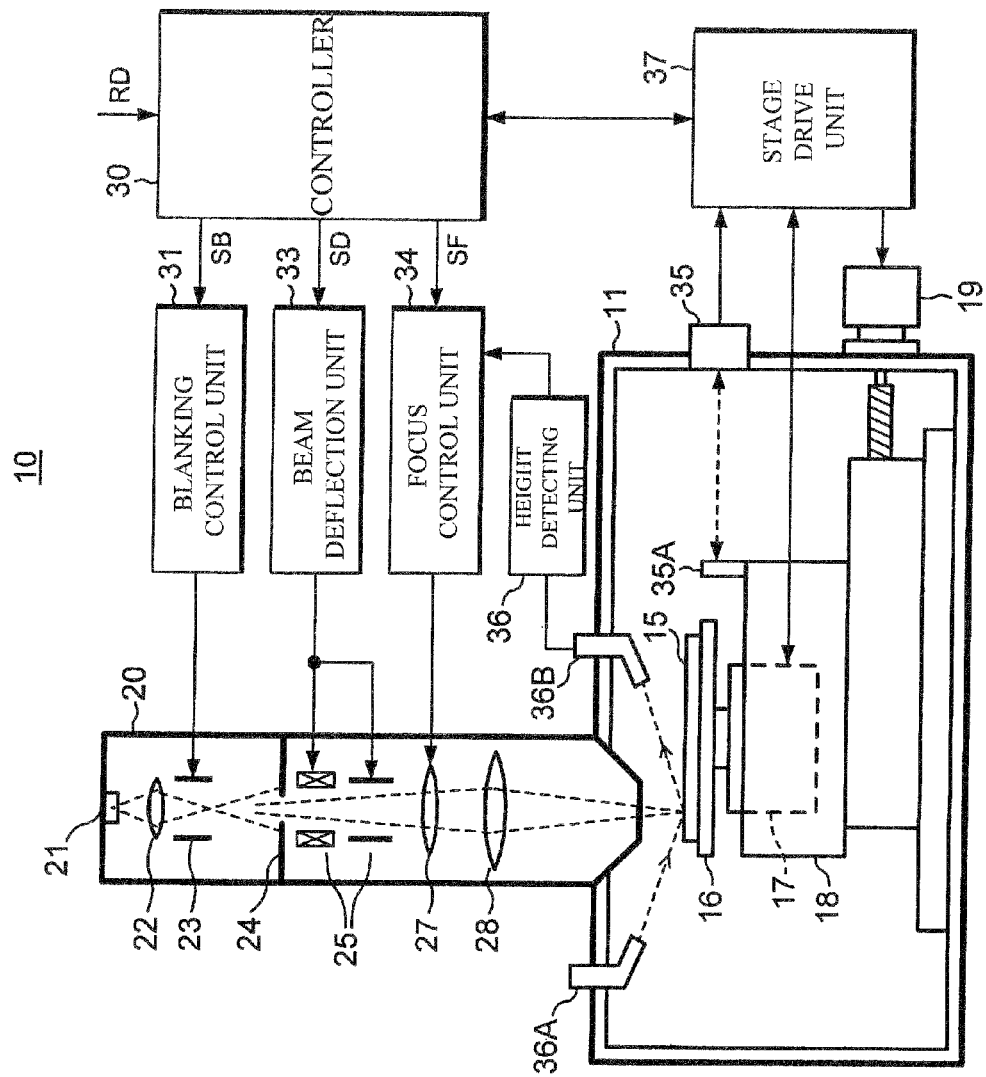
[FIG. 1]

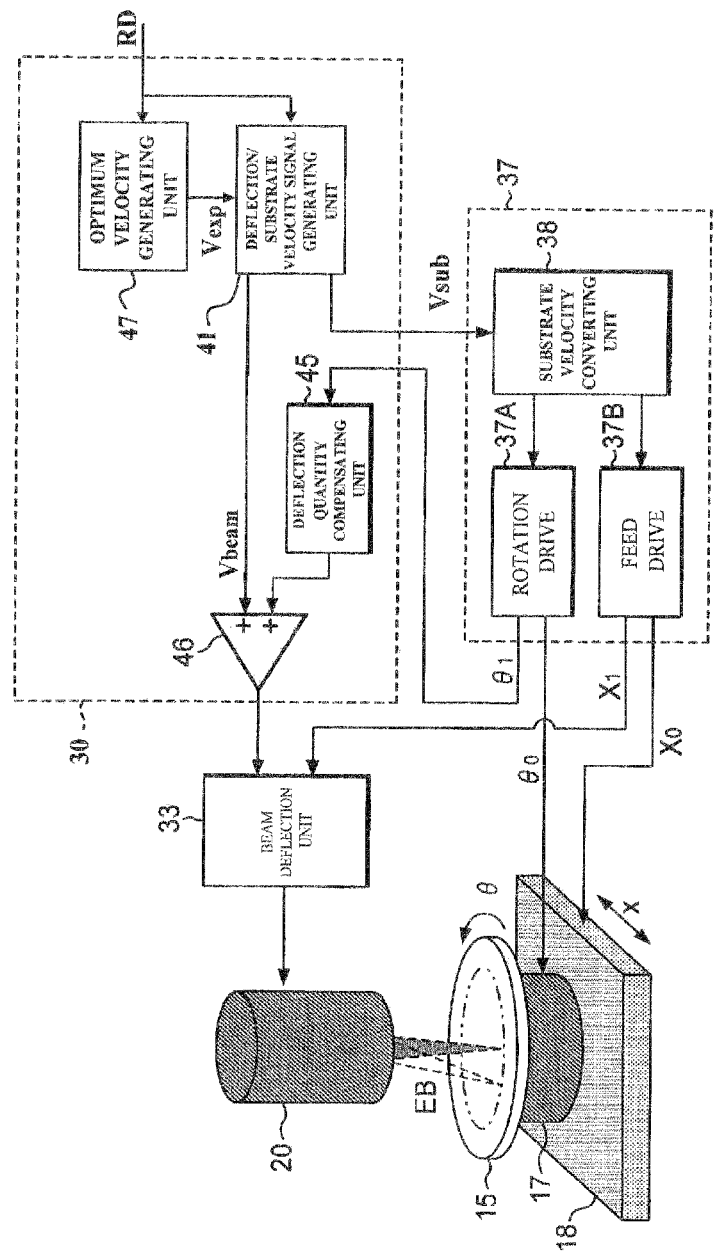
[FIG. 2]

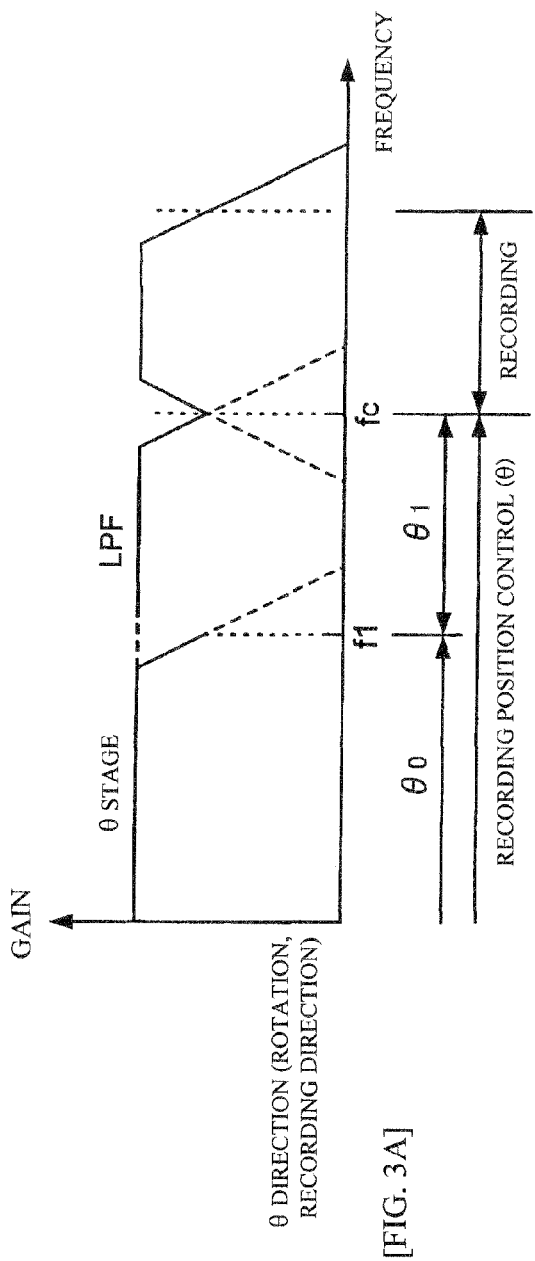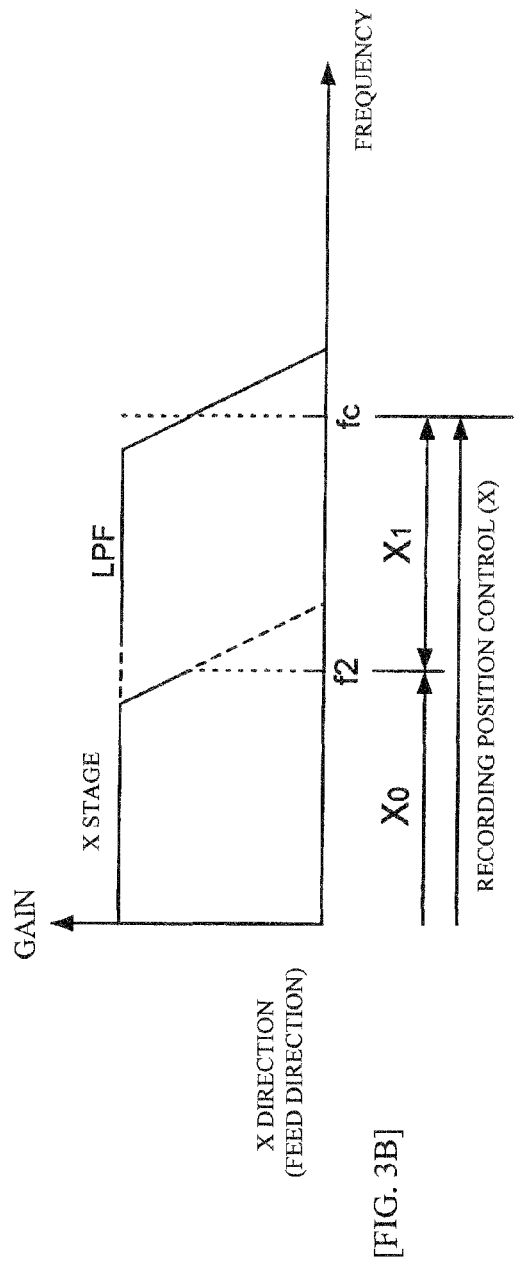
[FIG. 3A]
[FIG. 3B]

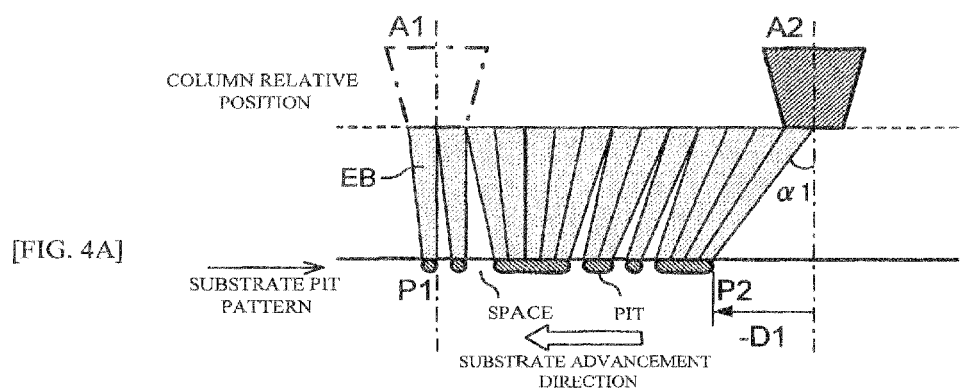
[FIG. 4A]
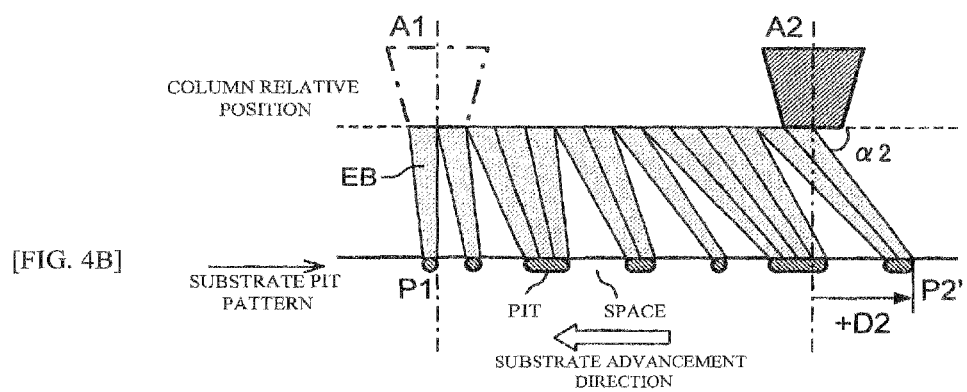
[FIG. 4B]

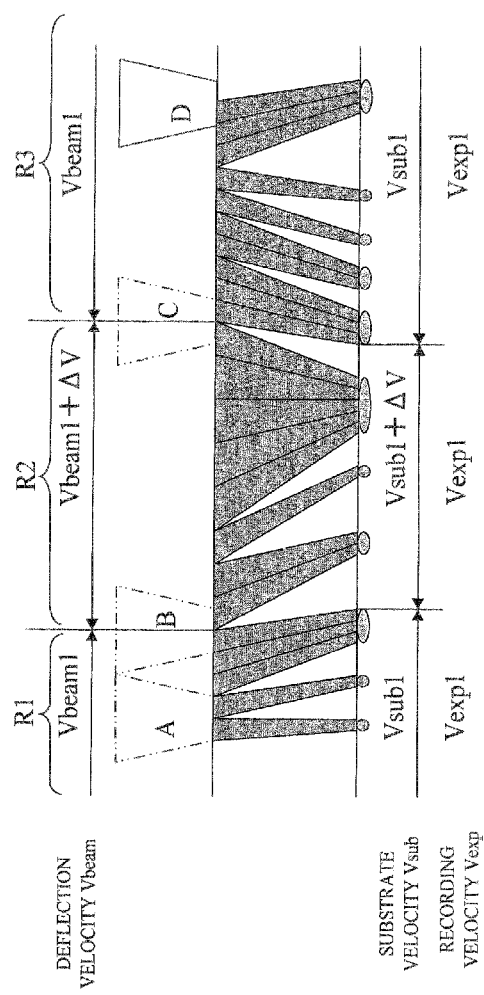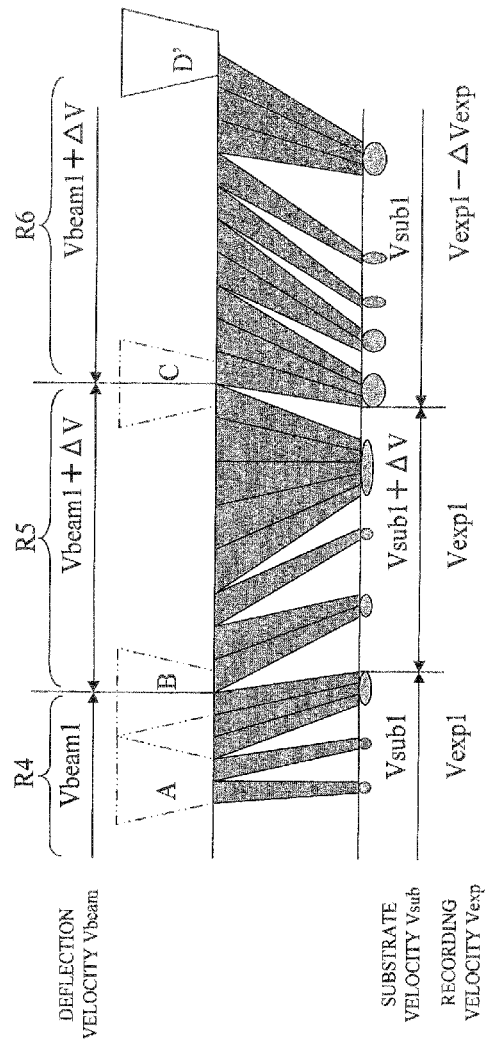

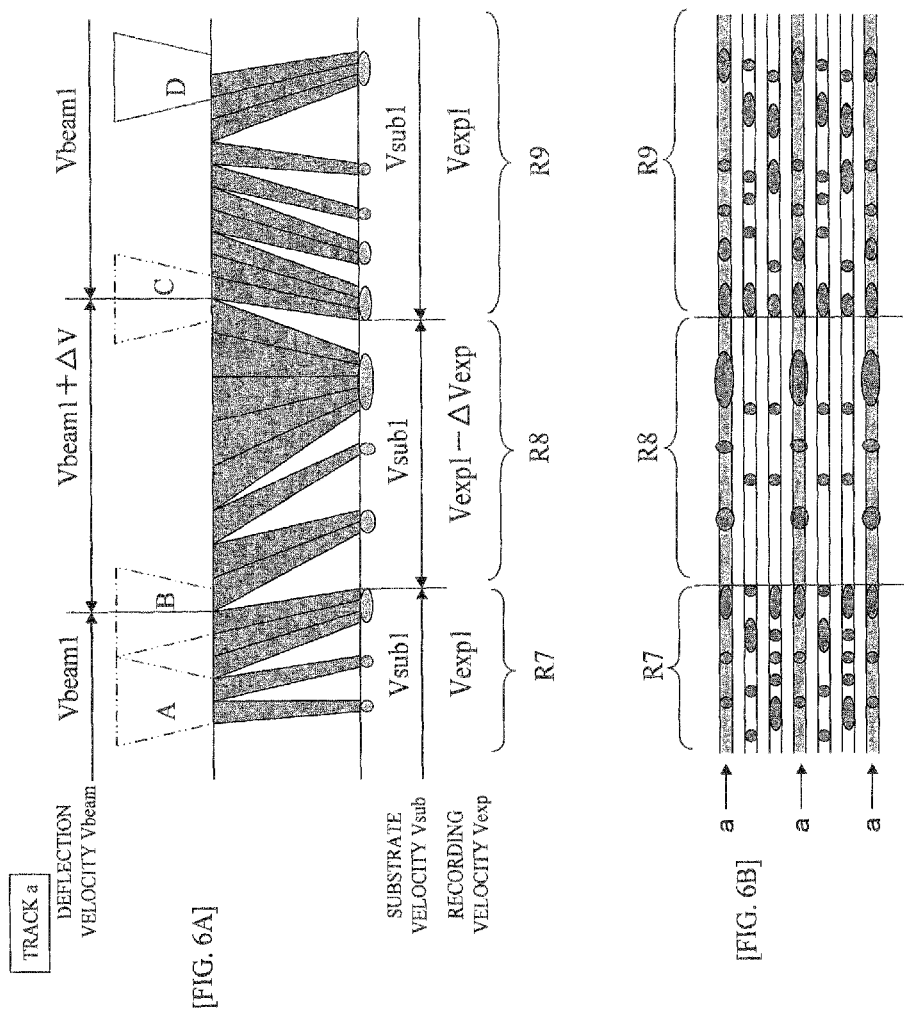

[FIG. 7]
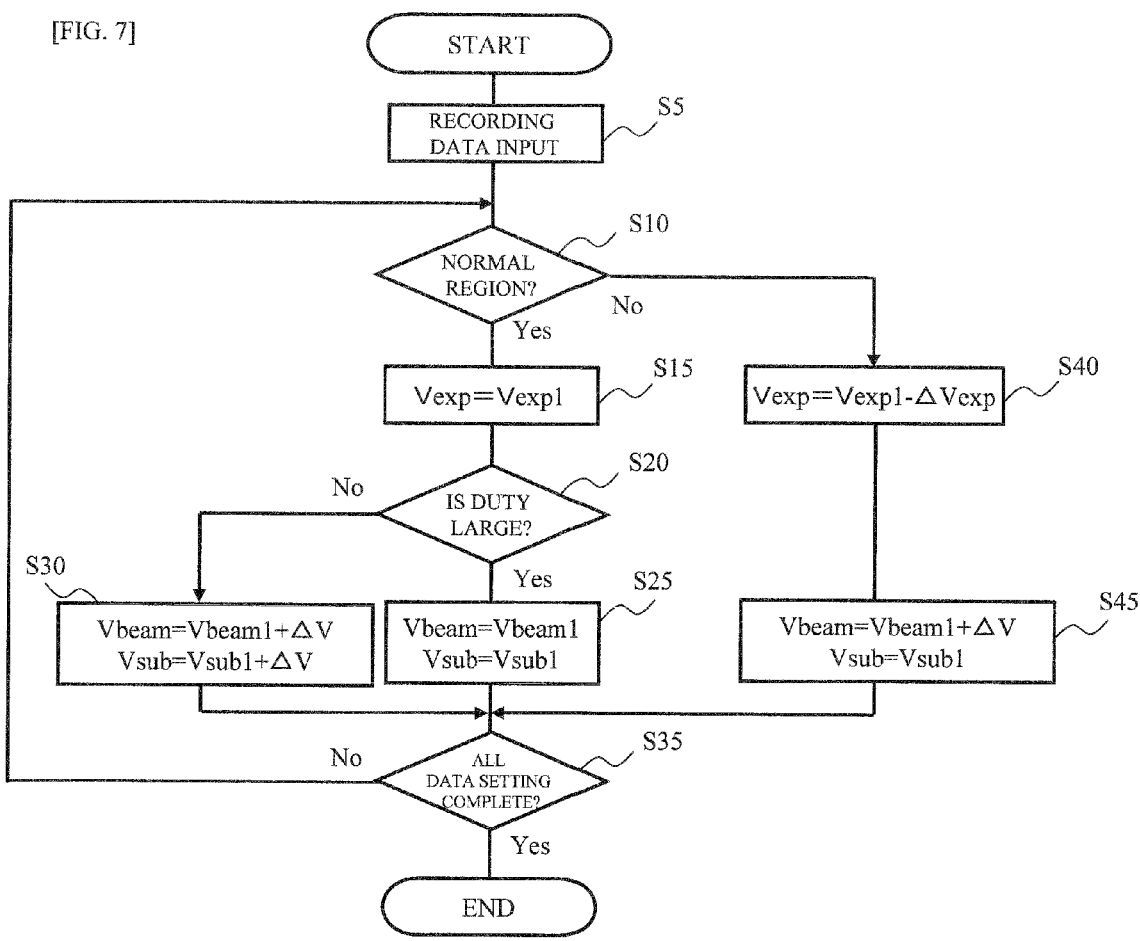

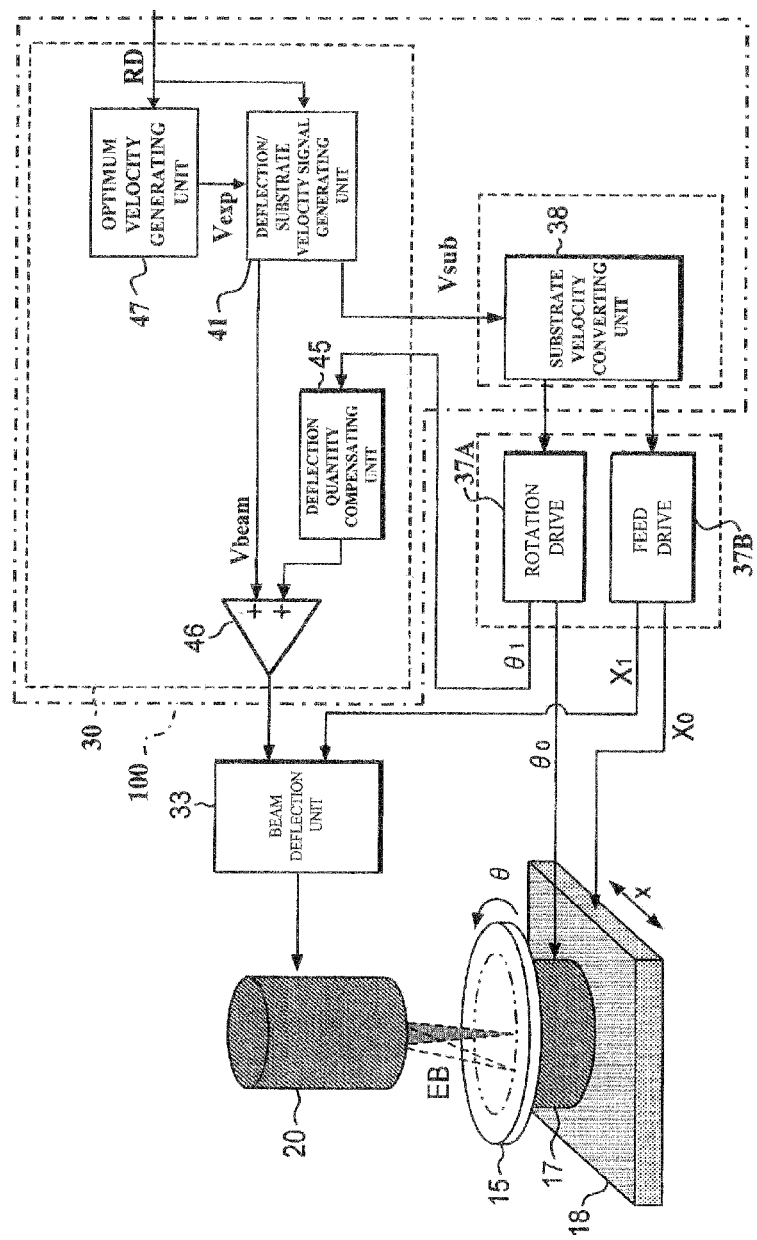
[FIG. 8]

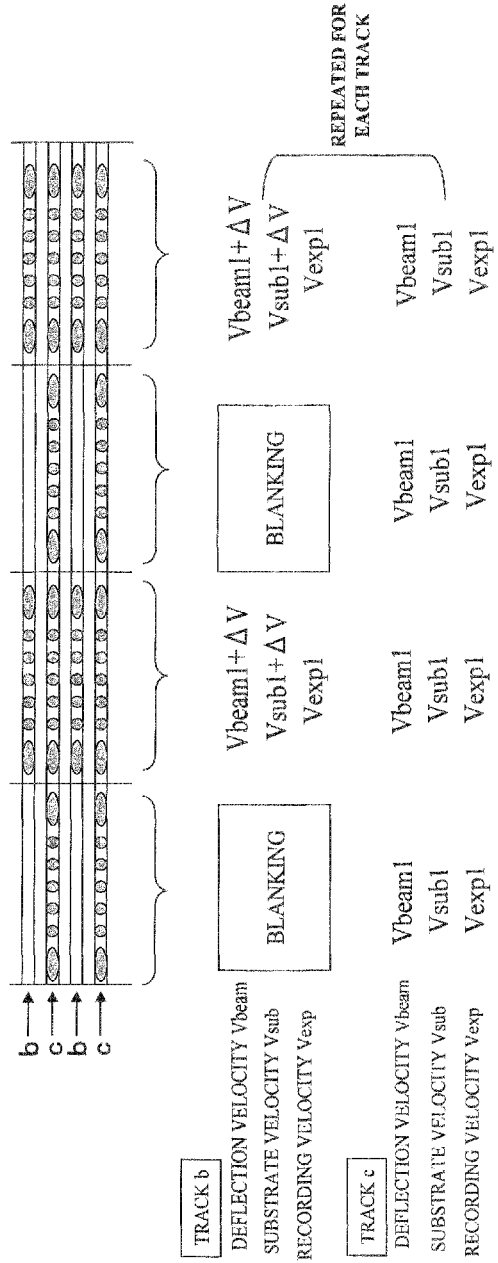

[FIG. 10]
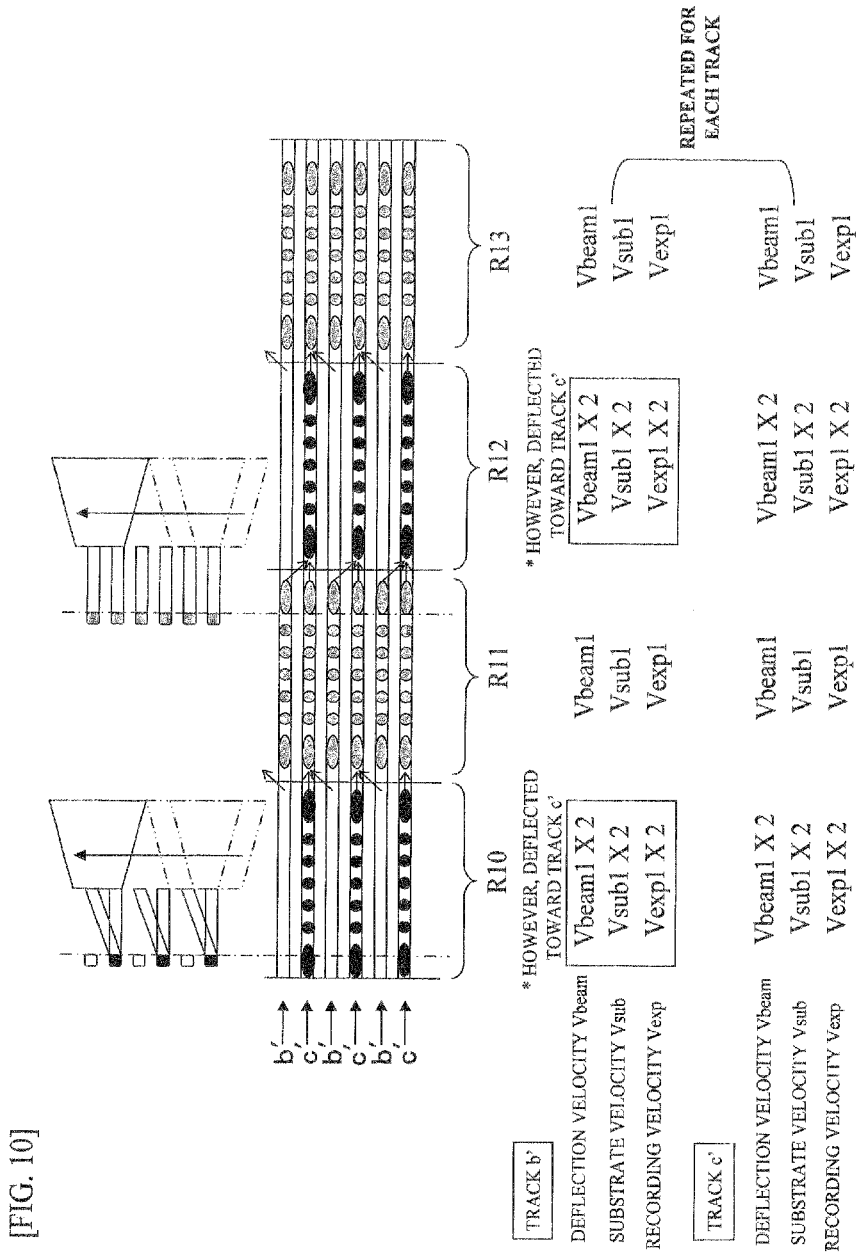

[FIG. 11]
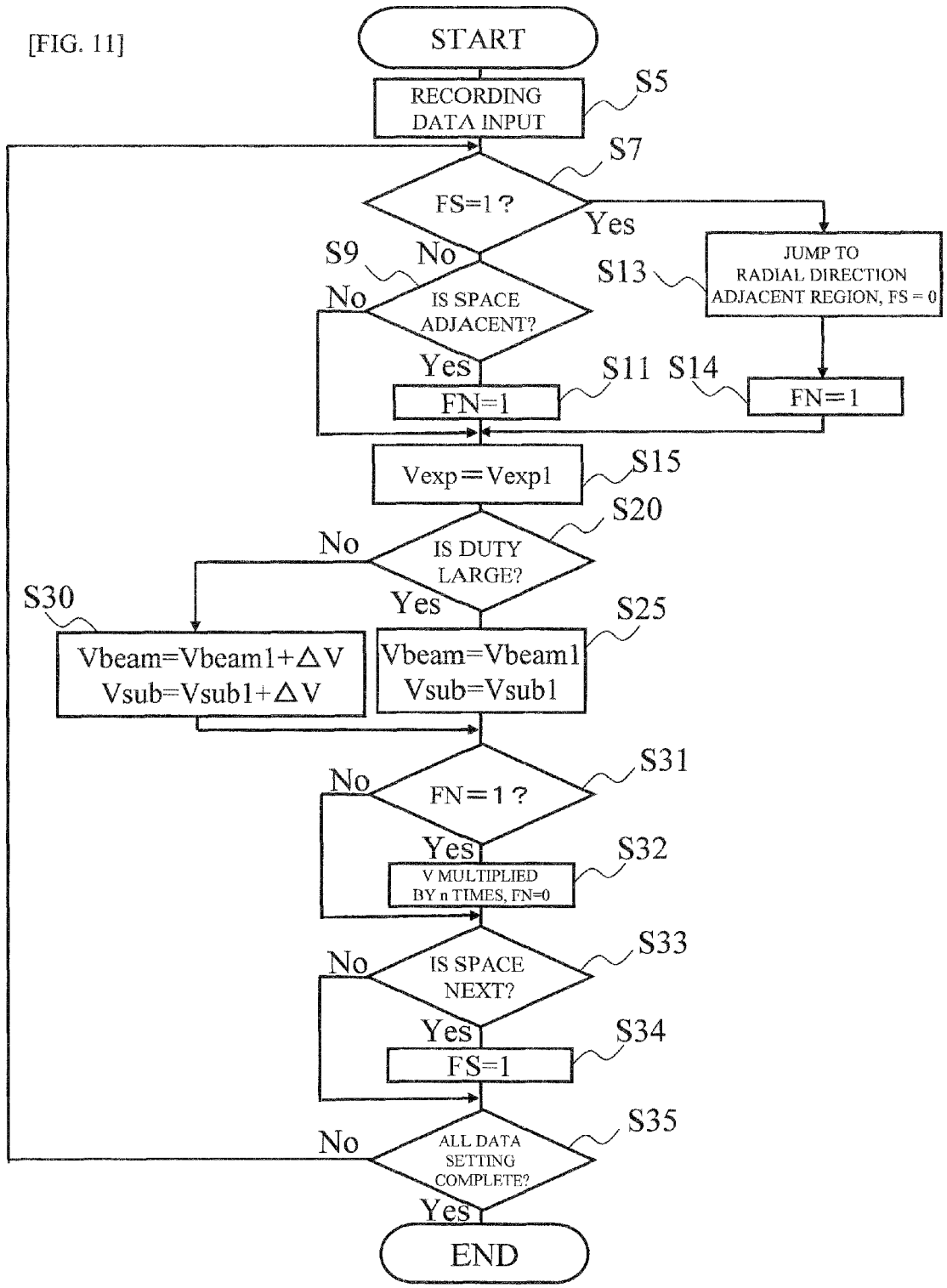

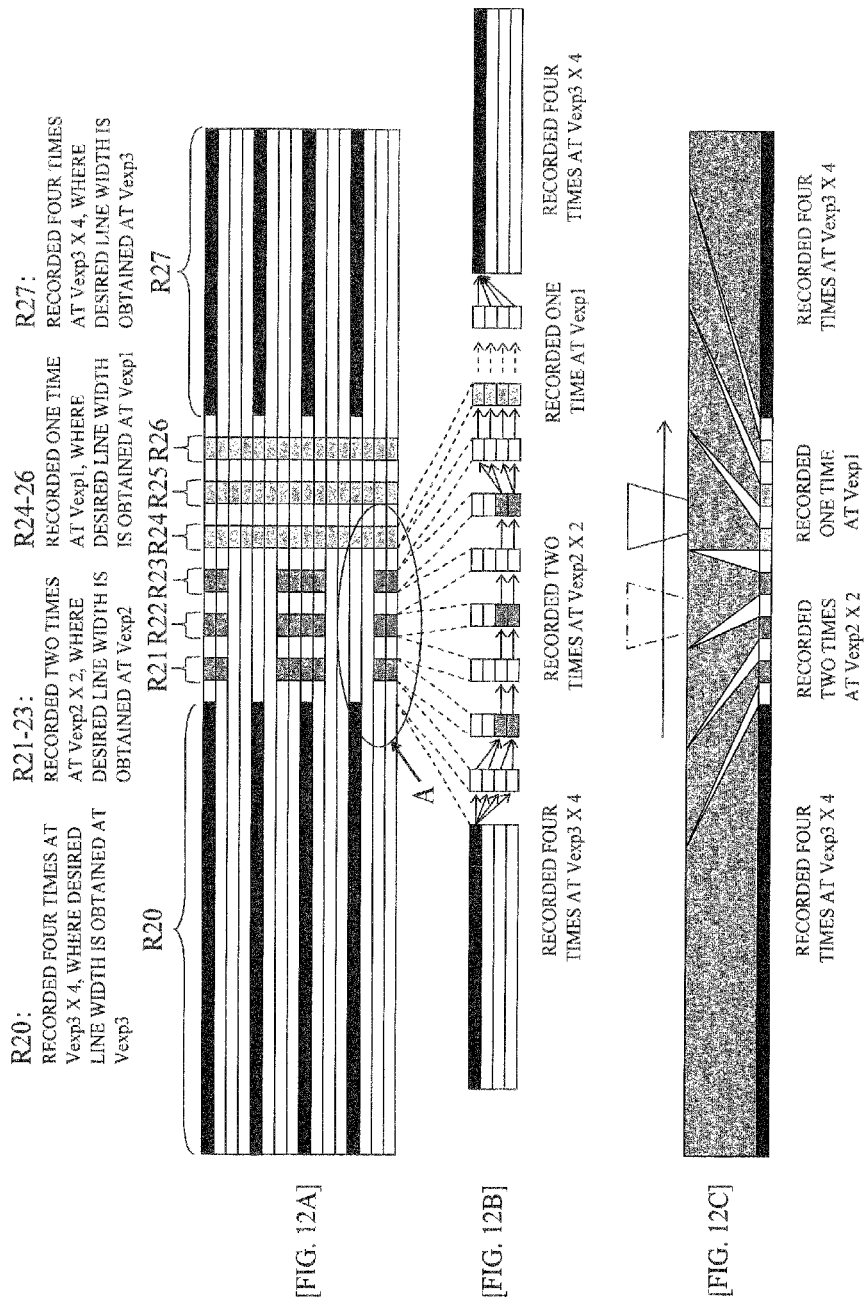

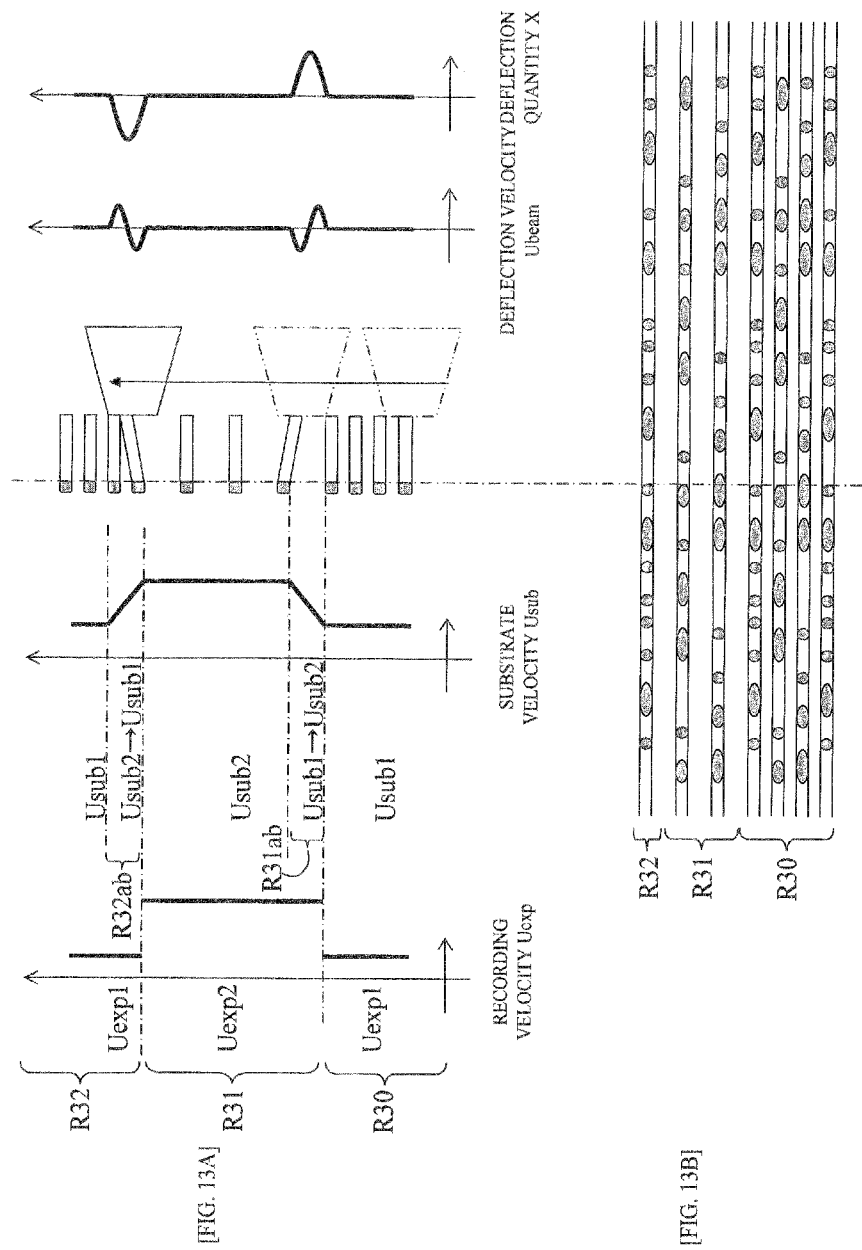

[FIG. 14]
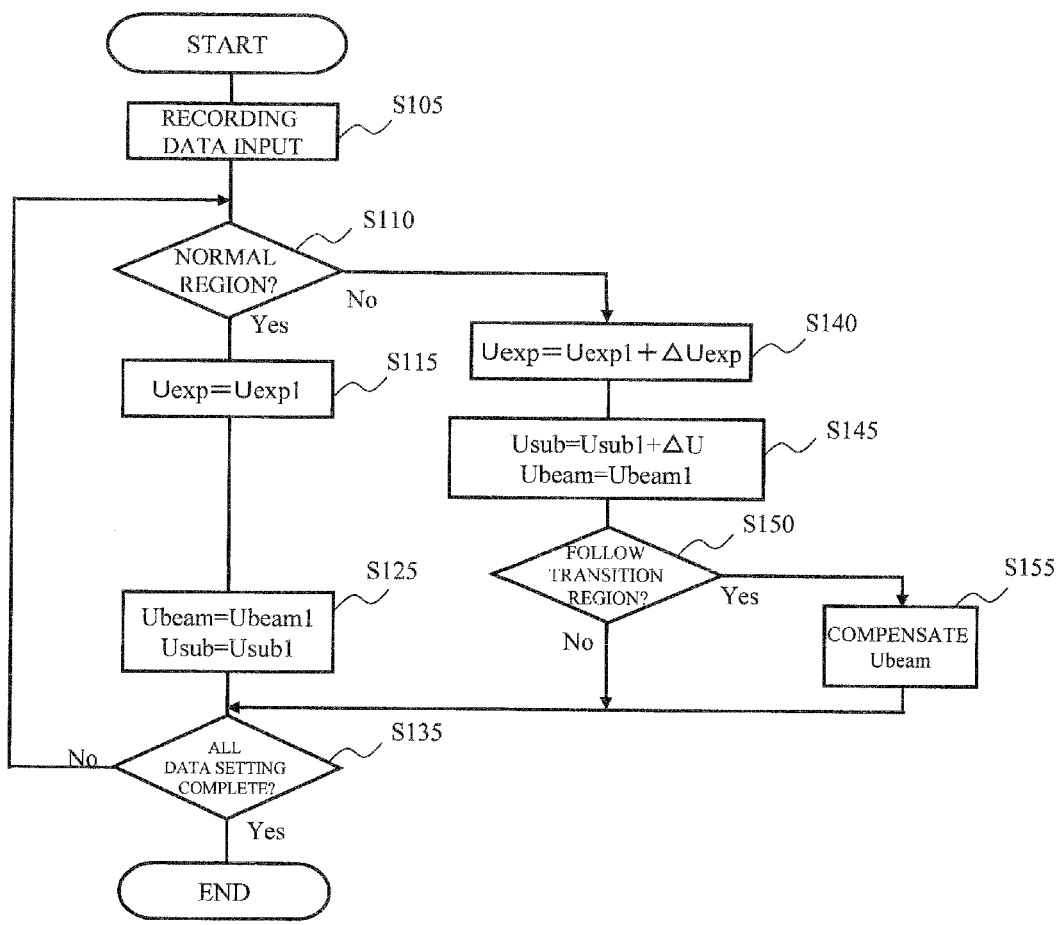

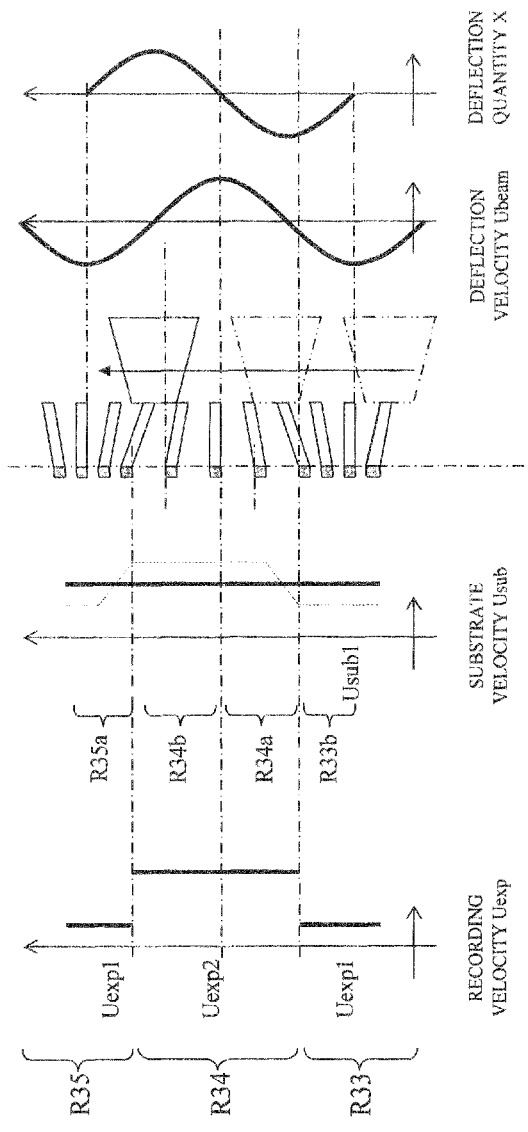

[FIG. 16]
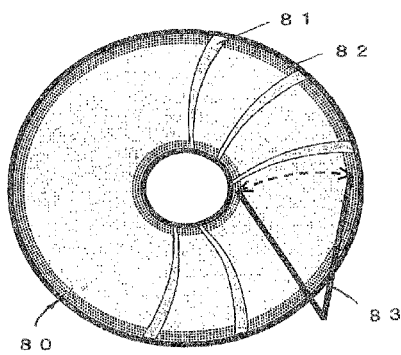

[FIG. 17]
[FIG. 18]
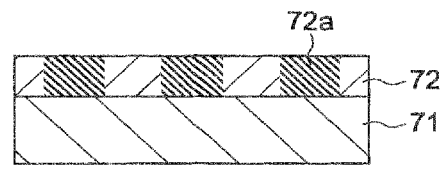
[FIG. 19]
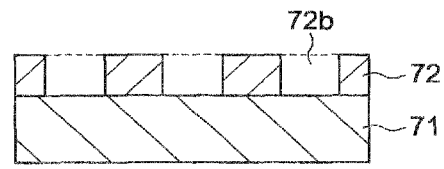

[FIG. 20]
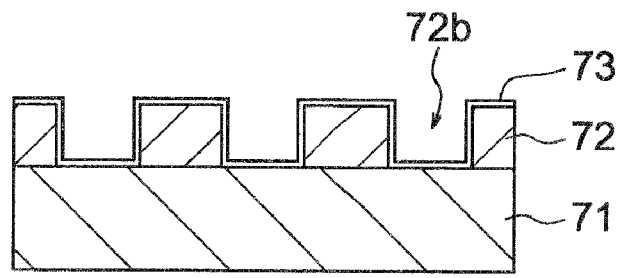
[FIG. 21]
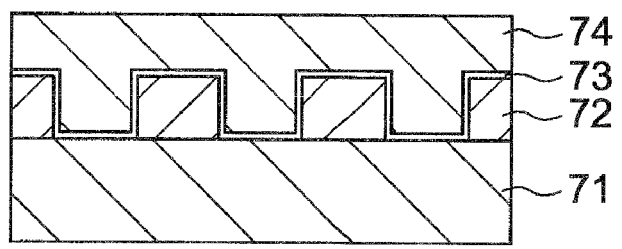
[FIG. 22]
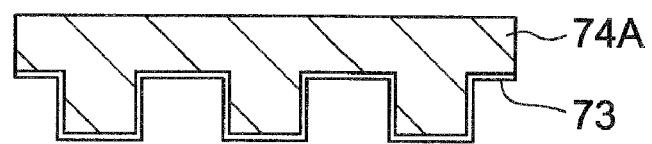

[FIG. 23]
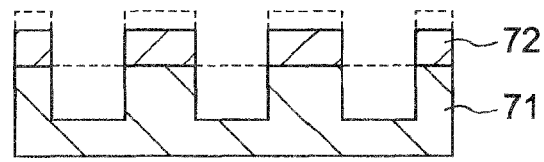
[FIG. 24]
[FIG. 25]
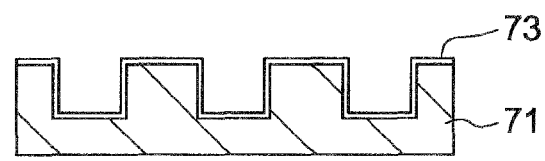
[FIG. 26]
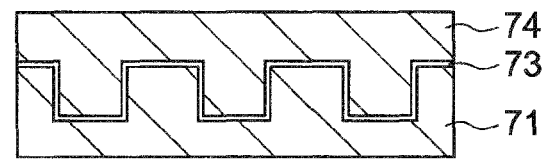
[FIG. 27]
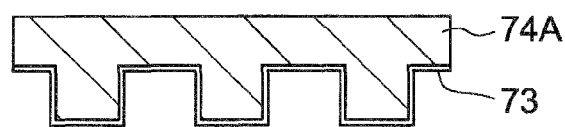

[FIG. 28]
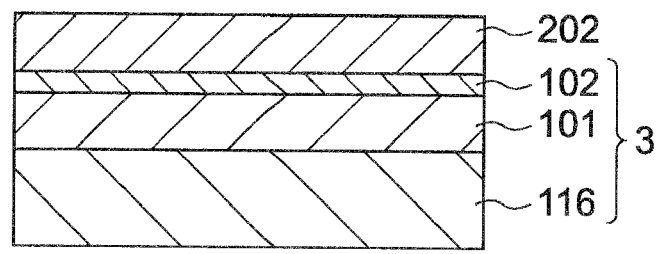
[FIG. 29]
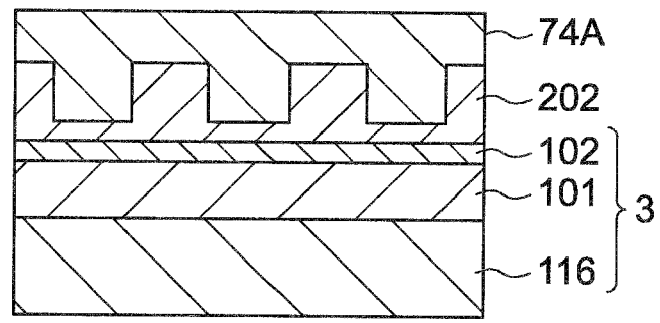
[FIG. 30]
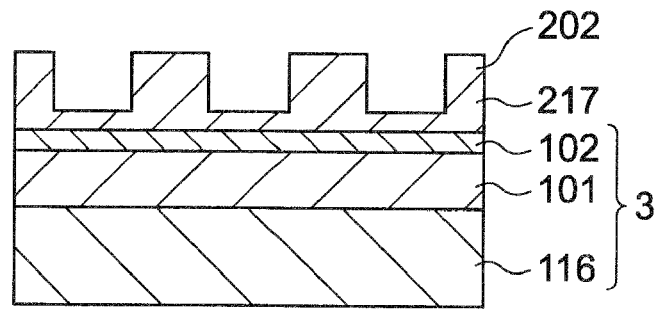

[FIG. 31]
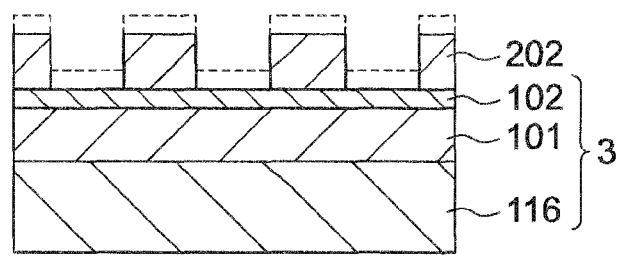
[FIG. 32]
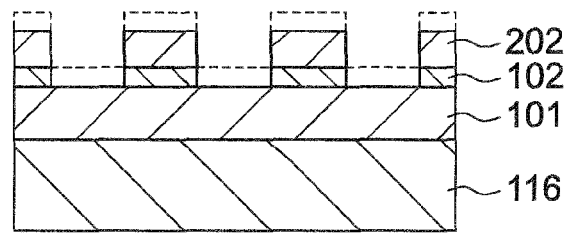
[FIG. 33]
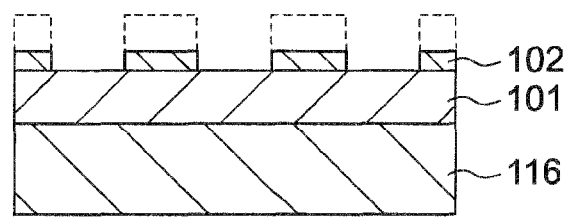
[FIG. 34]
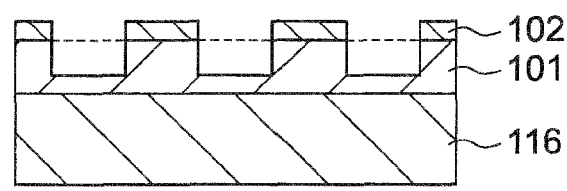

[FIG. 35]
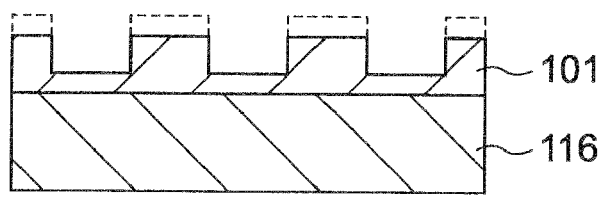
[FIG. 36]
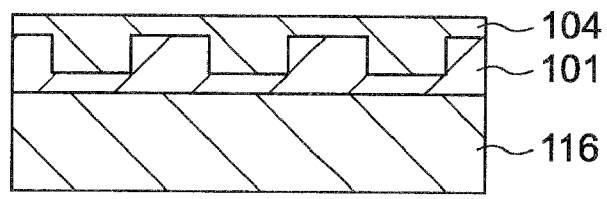
[FIG. 37]
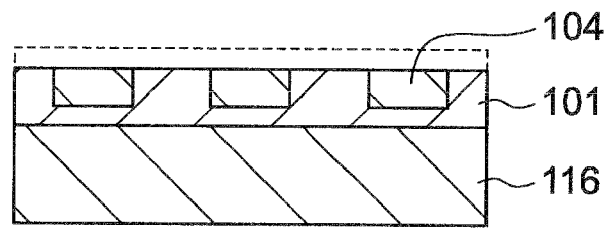
[FIG. 38]
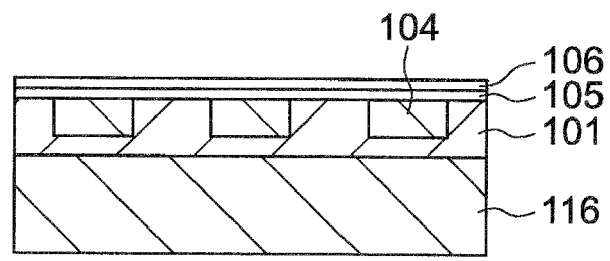

[FIG. 39]
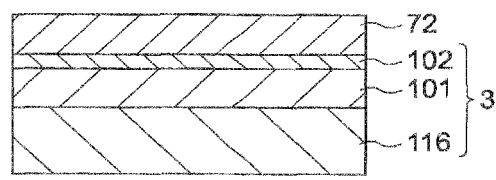
[FIG. 40]
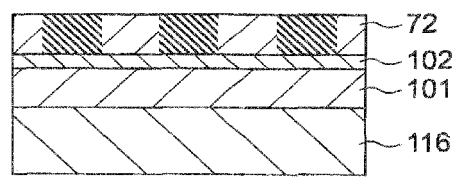
[FIG. 41]
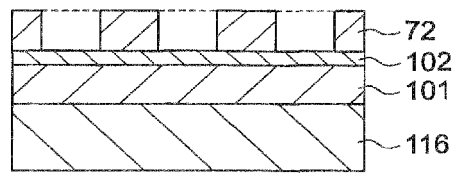

RECORDING APPARATUS, RECORDING CONTROL SIGNAL GENERATING APPARATUS, METHOD OF MANUFACTURING IMPRINT MOLD, IMPRINT MOLD, AND MAGNETIC DISC

CROSS-REFERENCE TO RELATED APPLICATION

This application is based on Japanese Patent Application No. 2006-070527 filed on Mar. 15, 2006, the contents of which is incorporated hereinto by reference.

BACKGROUND OF THE INVENTION

1. Field of the Invention

The present invention relates to a recording apparatus that uses an exposure beam such as an electron beam, laser beam or charged particle beam, and in particular, to a recording apparatus, recording control signal generating apparatus, method of manufacturing an imprint mold and imprint mold that produce a master disc of a recording medium such as a magnetic disc or optical disc using an exposure beam, and to a magnetic disc.

2. Description of the Related Art

Beam recording apparatuses that perform lithography using exposure beams such as electron beams or laser beams are widely used in master disc producing apparatuses of high-capacity discs such as optical discs such as Blu-ray discs, digital versatile discs (DVDs), hard discs for magnetic recording and the like.

For example, when producing an optical disc and the like, first, a predetermined concave and convex pattern is formed on the master disc, and a disc stamper is formed from this master disc. Then, using this disc stamper, synthetic resin and the like is hot-pressed or injection-molded, and metal vapor deposition is performed on the recording surface on which the pattern was transferred from the master disc, after which a transparent substrate and the like is formed.

Here, recording of the pattern on the master disc is performed by a beam recording apparatus. A beam recording apparatus performs control so as to depict tracks having a spiral or concentric circle form on the recording surface of the substrate by moving a beam in the appropriate radial direction while rotating the recording surface of the substrate that will become the master disc.

In this case, in the past, pits were recorded on the recording surface by switching beam irradiation on and off on the tracks by performing beam blanking (non-patent reference (refer to Y. Wada et al., High-density Recording Using an Electron Beam Recording Apparatus, Japan Journal of Applied Physics vol. 40)), or, instead of control of switching the beam on and off, a pit pattern was recorded by controlling beam deflection (refer to JP, A, 2000-315637).

Unfortunately, a problem of beam current loss occurs in prior art in which spaces in the data are achieved by blanking of the beam. Also, in prior art in which a pit pattern is recorded by beam deflection control, it is necessary to perform blanking on a long space because defocusing occurs when beam deflection is large. Therefore, the realization of a beam recording apparatus having high throughput and no beam current loss was desired.

The above described problem is given as one of examples the present invention should solve.

To overcome the problems mentioned above, the invention provides a recording apparatus that forms a latent image on a resist layer on a substrate by irradiating the resist layer with an exposure beam, the recording apparatus comprising: a recording velocity setting unit that variably sets the recording velocity in formation of the latent image; a beam deflection unit that moves the irradiation position of the exposure beam relative to the substrate; a substrate velocity adjusting unit that adjusts the movement velocity of the substrate; and a control unit that varies the deflection velocity of the exposure beam by the beam deflection unit, as well as the movement velocity of the substrate by the substrate velocity adjusting unit, in response to variations in the recording velocity; wherein: the control unit varies the movement velocity of the substrate in a predetermined direction by the substrate velocity adjusting unit so that it is relatively faster in the sparse regions in which the distribution of a recording pattern in the predetermined direction is more sparse than a predetermined condition, than in the dense regions in which the distribution of the recording pattern in the predetermined direction is more dense than the predetermined condition.

To overcome the problems mentioned above, the invention provides a recording apparatus that forms a latent image on a resist layer on a substrate by irradiating the resist layer with an exposure beam, the recording apparatus comprising: a recording velocity setting unit that variably sets the recording velocity in formation of the latent image; a beam deflection unit that moves the irradiation position of the exposure beam relative to the substrate; a substrate velocity adjusting unit that adjusts the movement velocity of the substrate; and a control unit that varies the deflection velocity of the exposure beam by the beam deflection unit, as well as the movement velocity of the substrate by the substrate velocity adjusting unit, in response to variations in the recording velocity; wherein: the control unit, within the resist layer on the substrate, controls the beam deflection unit so that, for at least a portion of the regions in which the radial direction distribution of the recording pattern is relatively sparse, latent image formation is performed by overlapping the same recording pattern into a plurality of times on that portion; and the recording velocity setting unit sets the tangential direction recording velocity according to the number of times the latent image formation is performed for the portion (region) in which the latent image formation is performed by overlapping the same recording pattern into a plurality of times.

To overcome the problems mentioned above, the invention provides a recording control signal generating apparatus that forms a latent image on a resist layer on a substrate by irradiating the resist layer with an exposure beam, the recording control signal generating apparatus comprising: a recording velocity setting unit that variably sets the recording velocity in formation of the latent image, which is the basis for controlling the deflection velocity of the exposure beam, so as to eliminate or reduce the irradiation interruption time of the exposure beam on the resist layer, and an deflection/substrate velocity setting unit that generates a recording control signal that varies the deflection velocity of the exposure beam and the movement velocity of the substrate in response to variations in the recording velocity; wherein: the recording velocity setting unit sets the recording velocity in the tangential direction to substantially constant in the normal exposure regions; and the deflection/substrate velocity setting unit, within the normal exposure regions, varies the tangential direction movement velocity of the substrate by the substrate velocity adjusting unit so that it is relatively faster, and varies the tangential direction deflection velocity of the exposure beam by the beam deflection unit so that it is relatively faster in the sparse regions, in which the tangential direction distribution of the recording pattern is relatively sparse, than in the dense regions, in which the tangential direction distribution of the recording pattern is relatively dense.

To overcome the problems mentioned above, the invention provides a recording control signal generating apparatus that forms a latent image on a resist layer on a substrate by irradiating the resist layer with an exposure beam, comprising a recording velocity setting unit that variably sets the recording velocity in formation of the latent image, which is the basis for controlling the deflection velocity of the exposure beam, so as to eliminate or reduce the irradiation interruption time of the exposure beam on the resist layer, and an deflection substrate velocity setting unit that generates a recording control signal that varies the deflection velocity of the exposure beam and the movement velocity of the substrate in response to variations in the recording velocity; wherein: the deflection/substrate velocity setting unit, within the resist layer on the substrate, controls the beam deflection unit so that, for at least a portion of the regions in which the radial direction distribution of the recording pattern is relatively sparse, latent image formation is performed by overlapping the same recording pattern into a plurality of times on that portion; and the recording velocity setting unit sets the tangential direction recording velocity according to the number of times that latent image formation is performed for the portion in which latent image formation is performed by overlapping the same recording pattern into a plurality of times.

To overcome the problems mentioned above, the invention provides a recording control signal generating apparatus that forms a latent image on a resist layer on a substrate by irradiating the resist layer with an exposure beam, the recording control signal generating apparatus comprising: a recording velocity setting unit that variably sets the recording velocity in formation of the latent image, which is the basis for controlling the deflection velocity of the exposure beam, so as to eliminate or reduce the irradiation interruption time of the exposure beam on the resist layer, and an deflection substrate velocity setting unit that generates a recording control signal that varies the deflection velocity of the exposure beam and the movement velocity of the substrate in response to variations in the recording velocity; wherein: the recording velocity setting unit, within the resist layer on the substrate, sets the recording velocity in the radial direction relatively faster in the sparse regions, in which the radial direction distribution of substantially-circular ring-shaped tracks where latent image formation is performed is more sparse than the predetermined condition, than in the dense regions, in which the radial direction distribution of the substantially-circular ring-shaped tracks is more dense than the predetermined condition; and the deflection/substrate velocity setting unit varies the radial direction movement velocity of the substrate so that it is relatively faster in the sparse regions, in which the radial direction distribution of the substantially-circular ring-shaped tracks is more sparse than the predetermined condition, than in the dense regions, in which the radial direction distribution of the substantially-circular ring-shaped tracks is more dense than the predetermined condition.

To overcome the problems mentioned above, the invention provides a method of manufacturing an imprint mold, the method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam relative to the substrate; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; and an imprint mold forming step, which transfers the latent image and forms an imprint mold having a concave and convex form; wherein: in the recording velocity setting step, the recording velocity in the tangential direction is set to substantially constant in the normal exposure regions; and in the controlling step, within the normal exposure regions, the tangential direction movement velocity of the substrate in the substrate velocity adjusting step is varied so that it is relatively faster, and the tangential direction deflection velocity of the exposure beam in the beam deflection step is varied so that it is relatively faster in the sparse regions, in which the tangential direction distribution of the recording pattern is more sparse than a predetermined condition, than in the dense regions, in which the tangential direction distribution of the recording pattern is more dense than the predetermined condition.

To overcome the problems mentioned above, the invention provides an imprint mold manufactured by an imprint mold manufacturing method, the imprint mold manufacturing method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; and an imprint mold forming step, which transfers the latent image and forms an imprint mold having a concave and convex form; wherein: in the recording velocity setting step, the recording velocity in the tangential direction is set to substantially constant in the normal exposure regions; and in the controlling step, within the normal exposure regions, the tangential direction movement velocity of the substrate in the substrate velocity adjusting step is varied so that it is relatively faster, and the tangential direction deflection velocity of the exposure beam in the beam deflection step is varied so that it is relatively faster in the sparse regions, in which the tangential direction distribution of the recording pattern is more sparse than a predetermined condition, than in the dense regions, in which the tangential direction distribution of the recording pattern is more dense than the predetermined condition.

To overcome the problems mentioned above, the invention provides a magnetic disc manufactured by a magnetic disc manufacturing method, the magnetic disc manufacturing method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; an imprint mold forming step, which transfers the latent image and forms an imprint mold having a concave and convex form; an imprinting step, which imprints the concave and convex form onto a base substrate used for a magnetic recording medium by pressing the imprint mold against it; and a replica forming step, which removes the imprint mold and forms a replica having the concave and convex form; wherein: in the recording velocity setting step, the recording velocity in the tangential direction is set to substantially constant in the normal exposure regions; and in the controlling step, within the normal exposure regions, the tangential direction movement velocity of the substrate in the substrate velocity adjusting step is varied so that it is relatively faster, and the tangential direction deflection velocity of the exposure beam in the beam deflection step is varied so that it is relatively faster in the sparse regions, in which the tangential direction distribution of the recording pattern is more sparse than a predetermined condition, than in the dense regions, in which the tangential direction distribution of the recording pattern is more dense than the predetermined condition.

To overcome the problems mentioned above, the invention provides a method of manufacturing an imprint mold, the method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam relative to the substrate; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; and an imprint mold forming step, which transfers the latent image and forms an imprint mold having a concave and convex form; wherein: in the controlling step, within the resist layer on the substrate, the beam deflection step is controlled so that, for at least a portion of the regions in which the radial direction distribution of the recording pattern is relatively sparse, latent image formation is performed by overlapping the same recording pattern into a plurality of times on that portion; and in the recording velocity setting step, the tangential direction recording velocity is set according to the number of times the latent image formation is performed for the portion (region) in which the latent image formation is performed by overlapping the same recording pattern into a plurality of times.

To overcome the problems mentioned above, the invention provides an imprint mold manufactured by a method of manufacturing an imprint mold, the method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; and an imprint mold forming step, which transfers the latent image and forms an imprint mold having a concave and convex form; wherein: in the controlling step, within the resist layer on the substrate, the beam deflection step is controlled so that, for at least a portion of the regions in which the radial direction distribution of the recording pattern is relatively sparse, latent image formation is performed by overlapping the same recording pattern into a plurality of times on that portion; and in the recording velocity setting step, the tangential direction recording velocity is set according to the number of times the latent image formation is performed for the portion (region) in which the latent image formation is performed by overlapping the same recording pattern into a plurality of times.

To overcome the problems mentioned above, the invention provides a magnetic disc manufactured by a method of manufacturing a magnetic disc, the method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; an imprint mold forming step, which transfers the latent image and forms an imprint mold having a concave and convex form; an imprinting step, which imprints the concave and convex form onto a base substrate used for a magnetic recording medium by pressing the imprint mold against it; and a replica forming step, which removes the imprint mold and forms a replica having the concave and convex form; wherein: in the controlling step, within the resist layer on the substrate, the beam deflection step is controlled so that, for at least a portion of the regions in which the radial direction distribution of the recording pattern is relatively sparse, latent image formation is performed by overlapping the same recording pattern into a plurality of times on that portion; and in the recording velocity setting step, the tangential direction recording velocity is set according to the number of times the latent image formation is performed for the portion (region) in which the latent image formation is performed by overlapping the same recording pattern into a plurality of times.

To overcome the problems mentioned above, the invention provides a method of manufacturing an imprint mold, the method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam relative to the substrate; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; and an imprint mold forming step, which transfers the latent image and forms an imprint mold having a concave and convex form; wherein: in the recording velocity setting step, within the resist layer on the substrate, the recording velocity in the radial direction is set to be relatively faster in the sparse regions, in which the radial direction distribution of substantially-circular ring-shaped tracks where the latent image formation is performed is more sparse than the predetermined condition, than in the dense regions, in which the radial direction distribution of the substantially-circular ring-shaped tracks is more dense than the predetermined condition, and in the controlling step, the radial direction movement velocity of the substrate by the substrate velocity adjusting step is varied so that it is relatively faster in the sparse regions, in which the radial direction distribution of the substantially-circular ring-shaped tracks is more sparse than the predetermined condition, than in the dense regions, in which the radial direction distribution of the substantially-circular ring-shaped tracks is more dense than the predetermined condition.

To overcome the problems mentioned above, the invention provides an imprint mold manufactured by a method of manufacturing an imprint mold, the method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; and an imprint mold forming step, which transfers the latent image and forms an imprint mold having a concave and convex form; wherein: in the recording velocity setting step, within the resist layer on the substrate, the recording velocity in the radial direction is set to be relatively faster in the sparse regions, in which the radial direction distribution of substantially-circular ring-shaped tracks where the latent image formation is performed is more sparse than the predetermined condition, than in the dense regions, in which the radial direction distribution of the substantially-circular ring-shaped tracks is more dense than the predetermined condition, and in the controlling step, the radial direction movement velocity of the substrate by the substrate velocity adjusting step is varied so that it is relatively faster in the sparse regions, in which the radial direction distribution of the substantially-circular ring-shaped tracks is more sparse than the predetermined condition, than in the dense regions, in which the radial direction distribution of the substantially-circular ring-shaped tracks is more dense than the predetermined condition.

To overcome the problems mentioned above, the invention provides a magnetic disc manufactured by a method of manufacturing a magnetic disc, the method comprising: a recording velocity setting step, which variably sets the recording velocity in formation of a latent image to be formed by irradiation of an exposure beam on a resist layer on a substrate while moving the substrate; a beam deflection step, which moves the irradiation position of the exposure beam; a substrate velocity adjusting step, which adjusts the movement velocity of the substrate; a controlling step, which varies the deflection velocity of the exposure beam and the movement velocity of the substrate in response to variations in the recording velocity; a latent image forming step, which forms a latent image on the resist layer; an imprint mold forming step, which transfers the latent image and forms an imprint mold having a concave and convex form; an imprinting step, which imprints the concave and convex form onto a base substrate used for a magnetic recording medium by pressing the imprint mold against it; and a replica forming step, which removes the imprint mold and forms a replica having the concave and convex form; wherein: in the recording velocity setting step, within the resist layer on the substrate, the recording velocity in the radial direction is set to be relatively faster in the sparse regions, in which the radial direction distribution of substantially-circular ring-shaped tracks where the latent image formation is performed is more sparse than the predetermined condition, than in the dense regions, in which the radial direction distribution of the substantially-circular ring-shaped tracks is more dense than the predetermined condition, and in the controlling step, the radial direction movement velocity of the substrate by the substrate velocity adjusting step is varied so that it is relatively faster in the sparse regions, in which the radial direction distribution of the substantially-circular ring-shaped tracks is more sparse than the predetermined condition, than in the dense regions, in which the radial direction distribution of the substantially-circular ring-shaped tracks is more dense than the predetermined condition.

DETAILED DESCRIPTION OF THE PREFERRED EMBODIMENTS

The following describes an embodiment of the present invention with reference to accompanying drawings.

FIG. 1 is a block diagram schematically illustrating the configuration of a recording apparatus (electron beam recording apparatus) of the present embodiment. The present embodiment is an embodiment in which this invention is adapted to a disc mastering device that creates a master disc for production of optical discs.

In FIG. 1, the electron beam recording apparatus 10 comprises a vacuum chamber 11; a turntable 16 arranged inside this vacuum chamber 11; a disc master substrate 15, of which the top surface is coated with resist and which is placed on the turntable 16; a spindle motor 17 that rotates the turntable 16 around a shaft perpendicular to the main surface of the disc substrate; a movement stage (hereinafter referred to as the X stage where appropriate) on the top part of which the spindle motor 17 is provided; an electron beam column 20 that is attached to the vacuum chamber 11; and a controller 30.

The vacuum chamber 11 is installed via a vibration isolating table such as an air damper (not shown in drawings), such that transmission of vibration from the outside is suppressed. The vacuum chamber 11 is set up such that a vacuum pump (not shown in drawings) is connected, and the inside of the vacuum chamber 11 becomes a vacuum atmosphere of a predetermined pressure by means of the vacuum pump exhausting air from inside the chamber. Furthermore, a light source 36A for detecting the height of the surface of the substrate 15, and an optical detecting unit 36B comprising, for example, a position sensor or CCD (charge coupled device), are provided in the vacuum chamber 11 (detailed functionality is described below).

The turntable 16 comprises an electrostatic chucking mechanism made of ceramic (not shown in drawings). The electrostatic chucking mechanism comprises a turntable 16 (ceramic) and electrodes comprising conductors for generating electrostatic polarization which are provided inside the turntable 16. A high-voltage power supply (not shown in drawings) is connected to the electrodes, and voltage is applied to the electrodes from the high-voltage power supply, thereby holding the substrate 15 by adsorption.

An X stage 18 is coupled with a movement motor 19 which is the movement (translational drive) apparatus, which can move the spindle motor 17 and turntable 16 in a predetermined direction (X direction) within a plane parallel to the main surface of the substrate 15; an Xθ stage comprises this X stage 18 and the spindle motor 17 and turntable 16.

In this case, a reflecting mirror 35A, which is part of a laser interference system 35, is arranged on the X stage 18. The laser interference system 35 measures the distance from a light source not shown in the diagrams to the X stage 18 using light reflected by the reflecting mirror 35A by a laser beam used for measurement, and transmits this measurement data, that is, the movement (X direction) position of the X stage 18, to the stage drive unit 37.

The rotation signal of the spindle motor 17 is also transmitted to the stage drive unit 37. The rotation signal includes a rotation synchronization signal that represents the reference rotation position of the substrate 15, and a pulse signal for each of the predetermined rotation angles from the reference rotation position. From the rotation signal, the stage drive unit 37 obtains the rotation angle, rotation velocity, rotation frequency and the like.

Based on the movement position data from the X stage 18 and the rotation signal from the spindle motor 17 obtained as described above, the stage drive unit 37 generates position data that represents the position of the electron beam spot on the substrate, and supplies it to the controller 30. Based on this position data, the controller 30 outputs a control signal to the stage drive unit 37, and based on that control signal from the controller 30, the stage drive unit 37 drives the spindle motor 17 and movement motor 19. That is, the rotation angle X of the turntable 16 (that is, the substrate 15) and the movement quantity of the stage 18, which are the drive quantities of the spindle motor 17 and X stage 18, are controlled by the controller 30 via the stage drive unit 37.

The case where there is an Xθ-type stage was described above, but it can also be configured such that an XY-type stage is used, in which the stage drive unit 37 controls the X and Y positions of the beam spot by driving the XY-type stage.

Inside the electron beam column 20, an electron gun (emitter) 21 that emits an electron beam, a convergent lens 22 that converges the emitted electron beam, blanking electrodes 23, an aperture 24, beam deflection electrodes 25, a focus lens 27 and an object lens 28 are arranged in that order, and additionally, alignment electrodes that perform position compensation of the electron beam based on a beam position compensation signal from the controller 30 are also contained therein.

The electron gun 21 emits an electron beam (EB) accelerated to several tens of KeV by a cathode (not shown in drawings) to which high voltage supplied from an accelerating high-voltage power supply (not shown in drawings) is applied.

The blanking electrodes 23 switch the electron beam on and off based on a modulated signal from the blanking control unit 31, which is controlled by a control signal from the controller 30. That is, voltage is applied between the blanking electrodes 23, which greatly incline the electron beam that passes through it, and as a result, the electron beam is prevented from passing through the aperture 24, such that the electron beam can be considered to be in the off state.

The beam deflection electrode 25 performs deflection control at high speed of the electron beam based on the control signal from a beam deflection unit 33 controlled by the control signal from the controller 30. With this deflection control, position control of the electron beam spot with respect to the substrate 15 is performed.

The focusing lens 27 is driven based on a drive signal from a focus control unit 34 controlled by the control signal from the controller 30, and focus control of the electron beam is performed.

At this time, a detection signal is input into the focus control unit 34 from the height detecting unit 36. In other words, the light detecting unit 36B receives a light beam emitted from the light source 36A and reflected off the surface of the substrate 15, and supplies the received signal to the height detecting unit 36. The height detecting unit 36 detects the height of the surface of the substrate 15 based on the received signal and generates a detection signal, and the focus control unit 34 performs focus control of the electron beam based on the detection signal.

Information data to be recorded (recording data) RD is supplied to the controller 30. The recording data RD is modulated data, for example, data modulated by 8/16 modulation and the like on a DVD disc. Based on this recording data RD and the movement position data and rotation position data, the controller 30 transmits a blanking control signal SB, deflection control signal SD (signal from an adder 46 described below and signal from movement drive unit 37B) and focus control signal SF to the blanking control unit 31, the beam deflection unit 33 and the focus control unit 34, respectively, and controls recording (lithography or irradiation). That is, based on the recording data, the resin on the substrate 15 is irradiated with the electron beam, and a latent image that corresponds to the recording bits is formed only in the locations exposed by irradiation with the electron beam, resulting in recording.

Note that in FIG. 1, main signal lines associated with the blanking control unit 31, the beam deflection unit 33, the focus control unit 34, and the stage driving unit 37 are shown, but these components are bi-directional connected with the controller 30 and constituted so as to be able to send and receive necessary signals.

In this case, the controller 30 divides the recording segment into a predetermined plurality of segments, and before it executes recording of recording data RD, it sets a recording velocity for each divided segment that is optimum for the desired purpose or operating configuration, and varies the deflection velocity and substrate velocity for each segment depending on its recording velocity, thereby controlling recording.

FIG. 2 is a functional block diagram illustrating an example of the detailed configuration of the portion of the controller 30 that performs deflection control of the beam and position control of the substrate 15. In FIG. 2, the controller 30 comprises an deflection substrate velocity signal generating unit 41 that generates a beam deflection signal and substrate velocity signal; an deflection quantity compensating unit 45; an adder 46; and an optimum velocity generating unit 47. The stage drive unit 37 comprises a substrate velocity converting unit 38; and a rotation drive unit 37A and movement drive unit 37B as the substrate velocity adjusting unit.

Based on the recording data RD input via a predetermined operating means (or other external device) not shown in the drawings furnished in the electron beam recording apparatus 10, the optimum velocity generating unit 47 calculates the recording velocity Vexp that corresponds to each recording area (recording segment), and outputs the corresponding signal. The recording velocity Vexp is represented by Vexp=Vsub−Vbeam, using the deflection velocity of the electron beam (EB) Vbeam and substrate velocity Vsub when recording each pit. The optimum velocity generating unit 47 sets a certain width so that optimum pit recording can be performed, corresponding to various lithography conditions such as resist sensitivity, layer thickness and ambient temperature, or recording conditions such as pit width and track pitch.

The deflection substrate velocity signal generating unit 41 takes input of the recording velocity (exposure velocity) Vexp from the optimum velocity generating unit 47 and the recording data RD from the operating means, and based on these, it generates the beam deflection signal Vbeam, which specifies the beam deflection quantity, and the substrate velocity signal Vsub, which specifies the movement velocity of the substrate 15. In this case, the deflection substrate velocity signal generating unit 41 controls the beam deflection quantity Vbeam and the substrate velocity Vsub so that the beam deflection angle is a predetermined target value, while maintaining the relationship Vsub−Vbeam=Vexp. As the target value in this case, the beam deflection angle is taken as zero (corresponding to the state where the beam impinges on the disc at a perpendicular), for example.

The deflection substrate velocity signal generating unit 41 comprises a low-pass filter which is not shown. The low-pass filter extracts from the signal which is the basis for the substrate velocity signal Vsub those components which are equal to or lower than a predetermined high-pass cut-off frequency fc (discussed in detail below) corresponding to the mechanical tracking limit of the Xθ stage, and supplies this to the substrate velocity conversion unit 38 of the stage driving unit 37 as the substrate velocity signal Vsub. Note that a band-pass filter (BPF) can also be used instead of the low-pass filter. The substrate velocity conversion unit 38 breaks the substrate velocity signal Vsub into a θ component and an X component, and supplies these to the rotation drive unit 37A and the movement (X direction) drive unit 37B, respectively.

The rotation drive unit 37A and the movement drive unit 37B drive the spindle motor 17 and the X stage 18 using predetermined frequency components in the θ component and X component of the substrate velocity signal Vsub of the substrate 15, in according with the fact that the Xθ stage system including the spindle motor 17 and the X stage 18 described above has a mechanical tracking limit. A detailed discussion of this is given using FIG. 3.

FIG. 3 is an explanatory diagram schematically showing the tracking frequency bands of the θ stage and the X stage, the pass frequency band of the low-pass filter (LPF), and the frequency band in which recording is performed.

In FIG. 3, the tracking limit frequency of the θ stage and the X stage are indicated by f1 and f2, respectively, and the high-pass cut-off frequency of the low-pass filter is indicated by fc. Below the limit frequencies for the θ stage and the X stage, the Xθ stage system is capable of mechanically tracking. In correspondence to this, the rotation drive unit 37A and the movement drive unit 37B extract a frequency rotation component (θ0) and a movement component (X0) below the limit frequencies f1 and f2 from the θ component and the X component in the substrate velocity signal Vsub of the substrate 15, in order to drive the spindle motor 17 and the X stage 18.

Returning to FIG. 2, the frequency rotation component (θ0) and the movement component (X0) below the limit frequencies f1 and f2 from the θ component and the X component in the substrate velocity signal Vsub of the substrate 15 extracted as described above are supplied by the rotation drive unit 37A and the movement drive unit 37B to the spindle motor 17 and the movement motor 19. On the other hand, the rotation component (θ1) and the movement component (X1), which are the remains exceeding the limit frequencies (f1 and f2) are supplied by the rotation drive unit 37A to the deflection amount compensation unit 45 or by the movement drive unit 37B to the beam deflection unit 33, respectively.

The deflection amount compensation unit 45 generates an deflection amount corresponding to the remainder component (θ1) and the radius position in the rotation direction of the substrate velocity signal Vsub, and outputs this to the adder 46.

The adder 46 adds the beam deflection signal Vbeam supplied by the deflection substrate velocity signal generating unit 41 discussed above and the compensation signal from the beam deflection compensation unit 45, and supplies this to the beam deflection unit 33.

Thus, the remainder error component of the mechanical system (Xθ stage system) with a narrow operating band is added to the beam deflection signal Vbeam by feeding forward, and is compensated by the deflection of the beam. The frequencies above the cut-off frequency (fc) of the low-pass filter (LPF) described above are used in pit recording.

Based on the configuration and control, an example of operation when the electron beam recording apparatus 10 records a pit pattern on an optical disc (electron beam lithography) is described below.

(A) Basic Principles Behind the Present Embodiment

FIG. 4A and FIG. 4B are drawings illustrating the basic principles behind the present embodiment. To simplify and clarify the explanation, they illustrate an example in which the recording velocity Vexp from the optimum velocity generating unit 47 is constant, and the substrate velocity Vsub output from the deflection substrate velocity signal generating unit 41 is constant. The drawings are explanatory diagrams schematically illustrating the deflection quantity of the electron beam in the case where electron beam recording is performed under those conditions. Furthermore, for ease of understanding, the drawings are illustrated such that the electron beam column 20 moves relative to the movement of the substrate, and the electron beam deflection quantity is exaggerated.

In FIG. 4A and FIG. 4B, when the substrate moves in the left direction in the diagram at substrate velocity Vsub, the deflection velocity Vbeam of the electron beam (EB) and the substrate velocity Vsub when each pit is recorded are controlled by the deflection substrate velocity signal generating unit 41 so as to maintain the relationship Vexp=Vsub−Vbeam as described above. In this example, because Vexp=const., they are controlled by the deflection substrate velocity signal generating unit 41 such that Vsub−Vbeam=const. Also, at spaces, high-velocity deflection is performed so that the beam is instantly moved forward to the recording position of the next pit, without blanking of the electron beam being performed.

In these drawings, FIG. 4A illustrates an example of the case of recording a pit pattern in which the recording data (modulated data) pits are dense (pit duty ratio is large). When recording of the pit pattern is performed from position P1 to position P2, the electron beam column 20 moves from relative position A1 to relative position A2. Because the duty ratio of the pits is large, the recording position deviates in the backward direction (in the movement direction of the substrate 15) with respect to the column position, and at recording position P2, the beam deflection quantity Vbeam is D1, and the deflection angle is a1. Furthermore, the deflection quantity Vbeam and −deflection angle a of the beam use a predetermined irradiation position as a reference; for example, the position at which the beam irradiates the substrate at a perpendicular is defined as the reference.

On the other hand, FIG. 4B illustrates an example of the case of recording a pit pattern in which the recording data (modulated data) pits are sparse (pit duty ratio is small). In this case, when the column position moves from A1 to A2, the recording position deviates in the forward direction with respect to the column position (opposite the movement direction of the substrate 15), and at recording position P2', the deflection quantity of the beam is +D2, and the deflection angle is a2. When these deflection quantities (D1, D2) are large, the beam deflection angle (a) with respect to the substrate is large, and the diameter of the beam spot increases, and pit convergence characteristics, such as deformation, may deteriorate and recording precision may decrease.

(B) Basic Behavior of the Present Embodiment (B-1) When Recording Velocity is Constant FIG. 5A and FIG. 5B are drawings schematically illustrating the basic behavior of recording control of the present embodiment. In these drawings, FIG. 5A illustrates an example in which the recording velocity Vexp from the optimum velocity generating unit 47 is equal to Vexp1 (constant value), as a simple explanation. The drawing is an explanatory diagram schematically illustrating the deflection quantity of the electron beam (EB) in the case where electron beam recording is performed in contiguous recording segments R1, R2 and R3 under those conditions. FIG. 5A illustrates the case where the duty ratio of the pits in recording segment R2 is less than a predetermined value (pits are sparse) (the case where the ratio of pits to space in that segment is below a predetermined value).

In FIG. 5A, in the recording segment R1 where the pit duty ratio is relatively large (within a predetermined range), recording is performed with substrate velocity Vsub=Vsub1, and deflection velocity Vbeam=Vbeam1. In this case, the velocity difference relationship Vsub−Vbeam=Vexp1 is satisfied as described above.

Next, in recording segment R2, in which the pit duty ratio is relatively small (outside a predetermined range), the substrate velocity and deflection velocity are each increased by □V, so that Vsub=Vsub1+□V, and Vbeam=Vbeam1+□V. That is, by varying them by the same velocity (□V), the pit recording velocity Vexp=Vexp1 is maintained at the same value without being varied. In short, the relationship Vsub−Vbeam=Vexp1 is maintained in the recording segment R2 as well.

Then, in recording segment R3, similar to recording segment R1, control is performed with substrate velocity Vsub=Vsub1, and deflection velocity Vbeam=Vbeam1.

In opposition to the case illustrated in FIG. 5A, in the case where the pit duty ratio in recording segment R2 is larger than a predetermined value (pits are dense), that is, the case where the ratio of pits with respect to space in that segment exceeds a predetermined value, the substrate velocity Vsub and deflection velocity Vbeam in segment R2 are each decreased by □V, so that Vsub=Vsub1−□V, and Vbeam=Vbeam1−□V.

(B-2) When Recording Velocity is Variable

On the other hand, FIG. 5B illustrates an example in which the recording velocity Vexp from the optimum velocity generating unit 47 varies (slows) along the way. The drawing is an explanatory diagram schematically illustrating the deflection quantity of the electron beam (EB) in the case where electron beam recording is performed in contiguous recording segments R4, R5 and R6 under those conditions.

In FIG. 5B, recording segments R4 and R5, in which the pit duty ratio is relatively large (within a predetermined range) or relatively small (outside a predetermined range), are the same as in the FIG. 5A. That is, in recording segment R4, recording is performed with substrate velocity Vsub=Vsub1 and deflection velocity Vbeam=Vbeam 1, and in recording segment R5, recording is performed by increasing to Vsub=Vsub1+□V and Vbeam=Vbeam1+□V. The relationship Vsub−Vbeam=Vexp1 is maintained between them, similar to that described above.

Then, when it gets to recording segment R6, the substrate velocity returns to Vsub=Vsub1 similar to in recording segment R4, whereas the deflection velocity is controlled so that Vbeam=Vbeam1+□V is maintained, similar to in recording segment R5. The substrate velocity in this case is such that Vsub−Vbeam=Vsub1−(Vbeam1+□V)<Vsub1−Vbeam1=Vexp1, which is slower than in recording segments R4 and R5. As a result, the recording thickness becomes thicker in the radial direction of the substrate 15, as illustrated in the drawing.

(B-3) Example of Specific Application

As an example of a specific application in which recording thickness is made slower by slowing the recording velocity as described above, an example is described in which the phenomenon in which recording data pits are sparse but the effect of backward scattering from the periphery is consequently reduced and recording thickness becomes narrow, is compensated for.

FIG. 6A and FIG. 6B express an example of the case where line width is made thick in order to perform the compensation. FIG. 6B is an explanatory diagram schematically illustrating the tracks of the substrate 15 in contiguous recording segments R7-R9 (including recording segment R8 in which the line width is made thick), and FIG. 6A is an explanatory diagram schematically illustrating the deflection quantity of the electron beam (EB) in the case where electron beam recording is performed on the track indicated by arrow a in FIG. 6B of segments R7-R9.

In general, when a latent image is formed by performing lithography on a resist layer with a beam, after the beam penetrates the resist layer, the so-called back-scattering phenomenon occurs, in which, inside the resist layer, part of it bounces back and returns to the front side of the resist layer while becoming thin and wide in a radiating shape. In this case, when viewed microscopically, lithography actually occurred in a surface area slightly larger than the surface area irradiated by the beam. That is, in FIG. 6A and FIG. 6B, in the part within each track having a resist layer where the radial direction distribution of the recording pattern is relatively dense (recording segments R7 and R9), the back-scattering accumulates when each dense recording pattern is irradiated and exposed, and lithography is accelerated. For this reason, there is the possibility of a difference in the degree of lithography and a difference in radial direction thickness compared to the part where the radial direction distribution of the recording pattern is relatively sparse (recording segment R8).

To compensate for this, in this example, the recording thickness is made thicker in the radial direction by reducing the recording velocity in recording segment R8. That is, in FIG. 6A and FIG. 6B, in recording segment R7, recording is performed with substrate velocity Vsub=Vsub1 and deflection velocity Vbeam=Vbeam 1, and the relationship Vsub−Vbeam=Vexp1 is maintained.

Then, when it goes to recording segment R8, the substrate velocity returns to Vsub=Vsub1 similar to in recording segment R7, whereas the deflection velocity is controlled so that it is increased to Vbeam=Vbeam1+□V. The recording velocity in this case is such that Vsub−Vbeam=Vsub1−(Vbeam1+□V)<Vsub1−Vbeam1=Vexp1, which is slower than in recording segment R7. As a result, for the track indicated by arrow a, the recording thickness becomes thicker in the radial direction of the substrate 15, as illustrated in the drawings.

After that, in recording segment R9, similar to in recording segment R7, recording is performed with substrate velocity Vsub=Vsub1 and deflection velocity Vbeam=Vbeam1, and the relationship Vsub−Vbeam=Vexp1 results, similar to that described above.

FIG. 7 is a flowchart illustrating the control procedure executed by the deflection substrate velocity signal generating unit 41 and the optimum velocity generating unit 47 of the controller 30 for executing the operation described by FIG. 6A and FIG. 6B.

In FIG. 7, in this example, the recording velocity Vexp, the deflection velocity Vbeam of the electron beam (EB) and the substrate velocity Vsub are preset before the start of the recording operation for each recording area (recording segment) based on recording data RD. First, in step S5, recording data RD is input from the predetermined operating means (or other external device) not shown in the diagrams as described above, into the optimum velocity generating unit 47 and substrate velocity signal generating unit 41.

After that, it moves to step S10, wherein the optimum velocity generating unit 47 judges whether the region whose velocity is to be set thereafter is a thick recording region in which line width is made thicker in order to reduce the effect of back-scattering (recording segment R8 in the track indicated by arrow a in the example), or whether it is a normal exposure region. If it is a normal exposure region, the judgment is satisfied and it moves to step S15.

In step S15, the recording velocity is set to the normal value Vexp1 by the optimum velocity generating unit 47, and it moves to step S20.

In step S20, based on the recording data RD that was input, the deflection substrate velocity signal generating unit 41 judges whether or not the pits of the recording data (modulated data) RD of that recording segment are relatively dense (pit duty ratio is larger than a predetermined threshold value). If the duty ratio is large, it moves to step S25, and the deflection substrate velocity signal generating unit 41 sets the substrate velocity Vsub and deflection velocity Vbeam to the normal values Vsub1 and Vbeam1, respectively. If the duty ratio is small, it moves to step S30, and the deflection substrate velocity signal generating unit 41 sets the substrate velocity Vsub and deflection velocity Vbeam to Vsub1+$\Delta$V and Vbeam1+$\Delta$V, which are increased by $\Delta$V ($\Delta$V>0), respectively.

On the other hand, if in the step S10 the optimum velocity generating unit 47 judged that the region whose velocity is to be set thereafter is a thick recording region in which line width is made thicker in order to reduce the effect of back-scattering (recording segment R8 in the track indicated by arrow a in the example), the judgment of step S10 is not satisfied, and it moves to step S40.

In step S40, the optimum velocity generating unit 47 sets the recording velocity to Vexp1−$\Delta$Vexp, which is reduced by $\Delta$Vexp ($\Delta$Vexp>0) from the normal value Vexp1, and it moves to step S45.

In step S45, the deflection substrate velocity signal generating unit 41 sets the substrate velocity Vsub to the normal value Vsub1, and sets the deflection velocity Vbeam to Vbeam1+$\Delta$V, which is increased by $\Delta$V ($\Delta$V>0).

As described above, when step S25, step S30 and step S45 are completed, it moves to step S35, in which the deflection substrate velocity signal generating unit 41 or optimum velocity generating unit 47 judges whether or not velocity setting of the recording region is complete for all of the recording data RD input in step S5. Until it is completed for all data, the judgment of step S35 is not satisfied and it returns to step S10 and repeats the same procedure. When velocity setting has been completed for all data, the judgment of step S35 is satisfied, and the process flow ends.

Furthermore, in the flowchart of FIG. 7, the regions are split into only three classifications: normal regions, regions in which the recording velocity Vexp is reduced in order to suppress the effects of back-scattering, and regions where duty is small. However, it is not limited to three classifications. For example, by changing the reference numerals, it can be expanded to regions in which the recording velocity Vexp is increased in order to suppress the effects of back-scattering, regions in which duty is larger than normal and the like, and it is also possible to expand this further into many levels depending on degree.

As described above, the recording apparatus 10 in the present embodiment is a recording apparatus 10 that forms a latent image on a resist layer formed on a substrate 15 by irradiating the resist layer with an exposure beam EB in response to a recording signal while moving the substrate 15, comprising a recording velocity setting unit (optimum velocity generating unit 47 in this example) that variably sets the tangential direction recording velocity Vexp in formation of the latent image; a beam deflection unit 33 that moves the irradiation position of the exposure beam EB relative to the substrate 15; a substrate velocity adjusting unit (rotation drive unit 37A and movement drive unit 37B of stage drive unit 37 in this example) that adjusts the tangential direction movement velocity Vsub of the substrate 15 based on the deflection quantity of the exposure beam EB by the beam deflection unit 33; and a control unit (deflection substrate velocity signal generating unit 41 in this example) that varies the tangential direction deflection velocity Vbeam of the exposure beam EB by the beam deflection unit 33, as well as the tangential direction movement velocity Vsub of the substrate 15 by the substrate velocity adjusting unit 37A and 37B, in response to variations in the tangential direction recording velocity Vexp.

In the recording apparatus 10 of the present embodiment, the resist layer is irradiated with the exposure beam EB in response to the recording signal and the latent image is formed while the substrate 15 on which the resist layer is formed is being moved. The irradiation position of the exposure beam EB with respect to the substrate 15 is moved by deflection of the beam deflection unit 33, and based on the beam deflection quantity, the tangential direction velocity Vsub of the substrate 15 is adjusted by the substrate velocity adjusting unit 37A and 37B. In this case, the control unit 41 varies the tangential direction deflection velocity Vbeam of the exposure beam EB by the beam deflection unit 33, as well as the tangential direction movement velocity Vsub by the substrate velocity adjusting unit-37A and 37B, in response to Vexp at the time of latent image formation, which is variably set by the recording velocity setting unit 47.

As a result, the tangential direction movement velocity Vsub of the substrate 15 and the tangential direction deflection velocity Vbeam of the exposure beam EB are relatively faster in the portions in which the tangential direction distribution of the recording pattern is relatively sparse (recording segment R2 in the example of FIG. 5A), and the tangential direction movement velocity Vsub of the substrate 15 and the tangential direction deflection velocity Vbeam of the exposure beam EB are relatively slower in the portions in which the tangential direction distribution of the recording pattern is relatively dense (recording segments R1 and R3 in the example of FIG. 5A), and as a result, the irradiation interruption time (in other words, blanking by the blanking control unit 31) of the exposure beam EB on the resist layer can be eliminated (or reduced).

In this case, when the tangential direction recording velocity Vexp set by the recording velocity setting unit 47 is substantially constant (in normal exposure regions, which are recording segments R1, R2 and R3 in the example of FIG. 5A and recording segments R4 and R5 in the example of FIG. 5B), the irradiation interruption time can be eliminated (or reduced) by making the degree of increase or decrease of the movement velocity Vsub of the substrate and the deflection velocity Vbeam of the exposure beam substantially the same. Also, when the recording pattern is to be thicker in the radial direction than in the normal exposure regions (thick recording regions, which is recording segment R6 in the example of FIG. 5B), the tangential direction recording velocity Vexp is set by the recording velocity setting unit 47 to be slower than in the normal exposure regions R4 and R5, and the movement velocity Vsub on the substrate 15 side is set to be relatively slower than in the case where the recording velocity Vexp is substantially constant, and as a result, thick irradiation can be realized while eliminating (or reducing) the exposure beam irradiation interruption time.

In the recording apparatus 10 in the embodiment, the control unit 41 controls either one of or both the tangential direction deflection velocity Vbeam of the exposure beam EB by the beam deflection unit 33 and tangential direction movement velocity Vsub of the substrate by the substrate velocity adjusting unit 37A and 37B, so as to eliminate or reduce the irradiation interruption time of the exposure beam EB on the resist layer.

By eliminating (or reducing) the irradiation interruption time, it is possible to realize a beam recording apparatus having high throughput and no beam current loss.

In the recording apparatus 10 in the embodiment, the recording velocity setting unit 47 sets the tangential direction recording velocity Vexp to substantially constant in the normal exposure regions R1-R3, R4 and R5; and the control unit 41, within the normal exposure regions, varies the tangential direction movement velocity Vsub of the substrate 15 by the substrate velocity adjusting unit 37A and 37B so that it is relatively faster, and varies the tangential direction deflection velocity Vbeam of the exposure beam EB by the beam deflection unit 33 so that it is relatively faster in the sparse regions R2 and R5, in which the tangential direction distribution of the recording pattern is more (expressed as "relatively" in the present embodiment) sparse than a predetermined condition, than in the dense regions R1, R3 and R4, in which the tangential direction distribution of the recording pattern is more (expressed as "relatively" in the present embodiment) dense than a predetermined condition.

Under the conditions in which the recording velocity Vexp is substantially constant, if the tangential direction movement velocity Vsub of the substrate 15 or the tangential direction deflection velocity Vbeam of the exposure beam EB is made to be substantially constant, it inevitably becomes necessary to interrupt irradiation (perform blanking) and beam current loss occurs in the spaces of the data of the recording pattern for regions in which the tangential direction distribution is relatively sparse. In the recording apparatus 10 in the embodiment, the tangential direction movement velocity Vsub of the substrate 15 is made relatively faster and the tangential direction deflection velocity Vbeam of the exposure beam EB is made relatively faster in the regions R2 and R5, in which the tangential direction distribution is relatively sparse, than in the regions R1, R3 and R4, in which it is dense, and as a result, the recording velocity Vexp is maintained substantially constant, and blanking by the blanking control unit 31 can be eliminated (or reduced).

In the recording apparatus 10 in the embodiment, the recording velocity setting unit 47, within the resist layer on the substrate 15, sets the tangential direction recording velocity Vexp in the thick recording region R6, in which the recording pattern in the radial direction is to be thicker than in the other recording regions R4 and R5 (normal exposure regions), so that it is slower than the tangential direction recording velocity Vexp in the other recording regions R4 and R5.

By setting the tangential direction recording velocity Vexp so that it is relatively slower in the thick recording region R6, the energy irradiated per unit surface area is larger, and irradiation that is thicker in the radial direction can be performed.

In the recording apparatus 10 in the embodiment, the recording velocity setting unit 47, within the resist layer on the substrate 15, sets the tangential direction recording velocity Vexp in the dense regions (recording segments R7 and R9 in the example of FIG. 6A and FIG. 6B), in which the radial direction distribution of the recording pattern is more dense than a predetermined condition, so that it is relatively faster, and within the resist layer on the substrate 15, sets the recording velocity Vexp in the sparse regions (recording segment R8 in the example of FIG. 6A and FIG. 6B), in which the radial direction distribution of the recording pattern is more sparse than that predetermined condition, so that it is relatively slower.

Due to the fact that the recording velocity setting unit 47 sets the tangential direction recording velocity Vexp so that it is relatively slower for the region R8 as a thick recording region, in which the radial direction distribution of the pattern is relatively sparse, the energy irradiated per unit surface area is larger and irradiation that is thicker in the radial direction can be performed in the irradiation of that region, while in the other portions R7 and R9, the radial direction thickness can be (effectively) made uniform.

Within the configuration of the electron beam recording apparatus 10 according to the present embodiment, within the control circuit 30 and the stage drive unit 37, part of the substrate velocity converting unit 38, as illustrated in FIG. 8, can be configured as a recording control signal generating apparatus (so-called formatter) 100 that is connected to the electron beam recording apparatus, and generates and inputs a control signal for latent image formation in the electron beam recording apparatus.

The recording signal generating apparatus 100 in this case is a recording signal generating apparatus 100 that generates a control signal for latent image formation, to a beam deflection unit 33 that moves the irradiation position of an exposure beam EB relative to a substrate 15 on top of which a resist layer is formed; to a substrate velocity adjusting unit (rotation drive unit 37A and movement drive unit 37B in this example) that adjusts the tangential direction movement velocity Vsub of the substrate based on the deflection quantity of the exposure beam EB by the beam deflection unit 33; and to a recording apparatus that forms a latent image on the resist layer by irradiating the resist layer on the substrate with the exposure beam EB of which the irradiation position is moved by the beam deflection unit 33 while moving the substrate 15 at tangential direction movement velocity Vsub adjusted by the substrate velocity adjusting unit 37A and 37B; comprising a recording velocity setting unit (optimum velocity generating unit 47 in this example) that variably sets the tangential direction velocity Vexp in formation of the latent image, which becomes the reference for control of the tangential direction deflection velocity Vbeam of the exposure beam EB by the beam deflection unit 33 in response to the recording signal RD, so as to eliminate or reduce the irradiation interruption time of the exposure beam EB on the resist layer; and an deflection substrate velocity setting unit (deflection substrate velocity signal generating unit 41 in this example) that generates a control signal to the beam deflection unit 33 and the substrate velocity adjusting unit 37A and 37B, so as to vary the tangential direction deflection velocity Vbeam of the exposure beam EB by the beam deflection unit 33 and the tangential direction movement velocity Vsub of the substrate 15 by the substrate velocity adjusting unit 37A and 37B, in response to variations in the tangential direction recording velocity Vexp.

The recording control signal generating apparatus 100 is equipped with an deflection substrate velocity setting unit 41 and a recording velocity setting unit 47. The deflection substrate velocity setting unit 41 varies the deflection velocity Vbeam of the exposure beam EB by the beam deflection unit 33 and the movement velocity Vsub of the substrate 15 by the substrate velocity adjusting unit 37A and 37B, in response to the recording velocity Vexp at the time of latent image formation that is variably set by the recording velocity setting unit 47. As a result, the tangential direction movement velocity Vsub of the substrate 15 and the tangential direction deflection velocity Vbeam of the exposure beam EB are made relatively faster in the portion R2, in which the tangential direction distribution of the recording pattern is relatively sparse, and the tangential direction movement velocity Vsub of the substrate 15 and the tangential direction deflection velocity Vbeam of the exposure beam EB are made relatively slower in the portions R1 and R3, in which the tangential direction distribution of the recording pattern is relatively dense, and as a result, the irradiation interruption time of the exposure beam EB on the resist layer can be eliminated (or reduced).

In this case, when the tangential direction recording velocity Vexp set by the recording velocity setting unit 47 is substantially constant (in the normal exposure regions, which are recording segments R1, R2 and R3, or R4 and R5), the irradiation interruption time can be eliminated (or reduced) by the deflection substrate velocity setting unit 41 making the degree of increase or decrease $\Box$V of the movement velocity Vsub of the substrate and the deflection velocity Vbeam of the exposure beam substantially the same. Also, when the recording pattern is to be thicker in the radial direction than in the normal exposure regions (in the thick recording region R6), the tangential direction recording velocity Vexp is set by the recording velocity setting unit 47 of the recording control signal generating apparatus 100 to be slower than in the normal exposure regions R4 and R5, and the movement velocity Vsub on the substrate 15 side is set by the deflection substrate velocity setting unit 41 to be relatively slower than in the case where the recording velocity Vexp is substantially constant, and as a result, thick irradiation can be realized while eliminating (or reducing) the exposure beam irradiation interruption time.

In the recording control signal generating apparatus 100, the recording velocity setting unit 47 sets the tangential direction recording velocity Vexp to substantially constant in the normal exposure regions R1-R3, R4 and R5; and the deflection substrate velocity setting unit 41, within the normal exposure regions, varies the tangential direction movement velocity Vsub of the substrate 15 by the substrate velocity adjusting unit 37A and 37B so that it is relatively faster, and varies the tangential direction deflection velocity Vbeam of the exposure beam EB by the beam deflection unit 33 so that it is relatively faster in the sparse regions R2 and R5, in which the tangential direction distribution of the recording pattern is more sparse than the predetermined condition, than in the dense regions R1, R3 and R4, in which the tangential direction distribution of the recording pattern is more dense than the predetermined condition.

Under the conditions in which the recording velocity Vexp is substantially constant, if the tangential direction movement velocity Vsub of the substrate 15 or the tangential direction deflection velocity Vbeam of the exposure beam EB is made to be substantially constant, it inevitably becomes necessary to interrupt irradiation (perform blanking) and beam current loss occurs in the spaces of the data of the recording pattern for regions in which the tangential direction distribution is relatively sparse. In the recording control signal generating apparatus 100, the deflection substrate velocity setting unit 41 makes the tangential direction movement Vsub of the substrate 15 relatively faster and the tangential direction deflection velocity Vbeam of the exposure beam EB relatively faster in the regions R2 and R5, in which the tangential direction distribution is relatively sparse, than in the regions R1, R3 and R4, in which it is dense, and as a result, the recording velocity Vexp is maintained substantially constant, and blanking can be eliminated (or reduced).

In the recording control signal generating apparatus 100, the recording velocity setting unit 47, within the resist layer on the substrate 15, sets the tangential direction recording velocity Vexp in the thick recording region R6, in which the recording pattern in the radial direction is to be thicker than in the other recording regions R4 and R5 (normal exposure regions), so that it is slower than the tangential direction recording velocity Vexp in the other recording regions R4 and R5.

By setting the tangential direction recording velocity Vexp so that it is relatively slower in the thick recording region R6, the energy irradiated per unit surface area is larger, and irradiation that is thicker in the radial direction can be performed.

In the recording control signal generating apparatus 100, the recording velocity setting unit 47, within the resist layer on the substrate 15, sets the tangential direction recording velocity Vexp in the dense regions R7 and R9, in which the radial direction distribution of the recording pattern is to be more dense (expressed as "relatively dense" in the present embodiment) than a predetermined condition, so that it is slower than the tangential direction recording velocity Vexp in the sparse region R8, in which the radial direction distribution of the recording pattern is more sparse (expressed as "relatively sparse" in the present embodiment) than that predetermined condition.

Due to the fact that the recording velocity setting unit 47 sets the tangential direction recording velocity Vexp so that it is relatively slower for the region R8 as a thick recording region, in which the radial direction distribution of the pattern is relatively sparse, the energy irradiated per unit surface area is larger and irradiation that is thicker in the radial direction can be performed in the irradiation of that region, while in the other portions R7 and R9 the radial direction thickness can be (effectively) made uniform.

Note that various modifications which are not described in particular can be made according to the present invention without departing from the spirit and scope of the invention. Such variations are described in order below.

(1) When Multilayer Formation (Overwriting) of Latent Image is Performed

In the regions in which the radial direction distribution of the recording pattern is relatively sparse on the substrate 15, the number of radial direction distributions is smaller than in the other regions in which the recording pattern distribution is dense. For example, if there are tracks in which the recording pattern is not distributed within the sparse regions as illustrated by track b of FIG. 9, blanking by the blanking control unit 31 may become necessary in that region. In particular, when the space in which there is no distribution pattern is long, even when a procedure is used in which the movement velocity Vsub of the substrate 15 illustrated in the FIG. 5A is increased (→Vsub+$\Box$V) and the radial direction deflection velocity Vbeam of the electron beam EB is correspondingly increased (→Vbeam+$\Box$V), it is not covered because the deflection limit of the electron beam EB is exceeded (it ends up being forced), and blanking becomes necessary, and normal tracks c in which blanking is not performed and tracks b in which blanking is performed are alternately repeated, and beam current can end up being wasted.

Assuming that overwrite is performed, when describing segments R10 and R12 which are the overwrite portions, the recording velocity Vexp is multiplied by n (in this case n=2→2×Vexp).

FIG. 11 is a flowchart illustrating the control procedure executed by the deflection substrate velocity signal generating unit 41 and the optimum velocity generating unit 47 of the controller 30 for executing the operation described by FIG.

10. Note that the procedures identical to those in FIG. 7 are denoted by the same reference numerals.

In FIG. 11, similar to FIG. 7, the recording velocity Vexp, the deflection velocity Vbeam of the electron beam (EB) and the substrate velocity Vsub are preset before the start of the recording operation for each recording area (recording segment) based on recording data RD. Furthermore, the below-described flag FN and flag FS are preset to initial values of 0 before the start of this process flow.

First, in step S5, recording data RD is input from the predetermined operating means (or other external device) not shown in the diagrams as described above, into the optimum velocity generating unit 47 and substrate velocity signal generating unit 41.

After that, in step S7, the optimum velocity generating unit 47 judges whether or not the flag FS, which indicates whether or not the recording segment whose velocity is to be set thereafter is space in which there is no recording data (or whether or not the duty is smaller than a predetermined value), is 1. Initially this judgment is not satisfied because the flag FS has been initialized to 0, and it moves to step S9.

In step S9, the optimum velocity generating unit 47 judges whether or not the recording segment that is adjacent to the current recording segment in the radial direction is space in which there is no recording data, based on the recording data RD input in step S5. For example, if there is space adjacent in the radial direction as in recording segments R10 and R12 of track c' illustrated in FIG. 10, this judgment is satisfied, and in step S11 it sets the flag FN to 1, which indicates multiple irradiation (multiple latent image formation), and moves to step S15. In step S9, if there is space adjacent in the radial direction (recording segments R11, R13 and the like of track c'), the judgment of step 9 is not satisfied, and it moves directly to step S15.

Step S15 through step S30 are the same as in the FIG. 7. In step S15, the recording velocity is set to the normal value Vexp1 by the optimum velocity generating unit 47, after which, in step 20, the deflection substrate velocity signal generating unit 41 judges whether or not the duty ratio of the pits of the recording data (modulated data) RD is larger than a predetermined threshold value. If the duty ratio is large, it moves to step 25, wherein the deflection/substrate signal generating unit 41 sets the substrate velocity Vsub and deflection velocity Vbeam to the normal values Vsub1 and Vbeam 1, respectively. If the duty ratio is small, in step 30 it sets them to Vsub1+□V and Vbeam1+□V, respectively.

When step S25 or step S30 is complete, it moves to step S31, wherein the deflection substrate velocity signal generating unit 41 or the optimum velocity generating unit 47 judges whether or not the flag FN is 1. If the current recording segment is adjacent to space in the radial direction (or the current recording segment is space, described below), judgment is satisfied because FN was set to 1 in the step S11 (or the below-described step S14), and it moves to step S32.

In step 32, the deflection velocity Vbeam of the electron beam or the movement velocity Vsub of the substrate 15 set by the deflection substrate velocity signal generating unit 41 in the step S25 or step S30 is multiplied by n, which is the number of times the multiple formation is to be performed (calculated by the deflection substrate velocity signal generating unit 41 by a procedure not shown in the diagrams). As a result, the recording velocity Vexp determined by the difference between the deflection velocity Vbeam and the movement velocity Vsub of the substrate 15 is also multiplied by n. Then, after the flag FN is returned to 0, it moves to step S33. Furthermore, if the judgment of step S9 is not satisfied and the flag FN remains as is at 0, the judgment of step S31 is not satisfied, and it moves to step S33 in that state.

In step S33, the deflection substrate velocity signal generating unit 41 or the optimum velocity generating unit 47 judges whether or not the next recording segment that is adjacent to the current recording segment in the tangential direction is space in which there is no recording data, based on the recording data RD input in step S5. For example, if there is space adjacent in the tangential direction as in recording segments R11 and R13 of track b' illustrated in FIG. 10, this judgment is satisfied, and in step S34 it sets the flag FS to 1, and moves to step S35. In step S33, if the next recording segment is space (recording segments R10, R12 and the like of track c' or track b'), the judgment of step 33 is not satisfied, and it moves directly to step S35.

In step 35, the deflection substrate velocity signal generating unit 41 or optimum velocity generating unit 47 judges whether or not velocity setting of the recording region is complete for all of the recording data RD input in step S5. When velocity setting has been completed for all data, the judgment of step S35 is satisfied, and the process flow ends. Until it is completed for all data, the judgment of step S35 is not satisfied and it returns to step S7 and repeats the same procedure.

When it returns to step S7 in this manner, if the flag FS was set to 1 in step 34, which indicates that the next recording segment is space (as in recording segments R11 and R13 of track b'), the judgment of step S7 is satisfied, and it moves to step S13.

In step 13, the deflection substrate velocity signal generating unit 41 performs setting such that recording is performed in the recording segment adjacent to the current recording segment in the radial direction (such that track jumping is performed), based on the recording data RD input in step S5. As an example of this case, as in recording segments R10 and R12 of track b' illustrated in FIG. 10, it performs setting (of beam deflection) such that recording is performed not in track b', but in track c' which is adjacent in the radial direction. After that, in step S14 which is the same as step S11, the flag FN is set to 1, which indicates multilayer irradiation (multilayer latent image formation), and it moves to step 15. Step 15 and thereafter are the same as described above.

In the recording apparatus 10 in the present variation example, the control unit 41, within the resist layer on the substrate 15, controls the beam deflection unit 33 so that, for at least a portion of the regions in which the radial direction distribution of the recording pattern is relatively sparse (recording segments R10 and R12 in this example), latent image formation is performed by dividing the same recording pattern into a plurality of times (n times in this example) on that portion; and the recording velocity setting unit 47 sets the tangential direction recording velocity Vexp according to the number of times that latent image formation is performed for the portions (regions R10 and R12) in which latent image formation is performed by dividing the same recording pattern into a plurality of times.

Within the sparse regions R10 and R12, for track c' in which the recording pattern is distributed as portions where multiple latent image formation is performed, by inclining the exposure beam EB in the radial direction toward track c' in which the recording pattern is distributed each time the exposure beam EB approaches the track b' in which the recording pattern is not distributed, latent image formation is performed n times, and when this portion is completed, it returns to the original track b' and continues recording. In this manner, when it approaches a location where blanking is to be performed, it moves to another separate track in the radial direction and performs latent image formation, and as a result, blanking is not performed by the blanking control unit 31, and therefore throughput is improved. Also, for the locations R10 and R12 where multiple latent image formation is performed, the tangential direction recording velocity Vexp can be set to be relatively faster, assuming multiple formations. As a result, operation can be performed with even greater efficiency.

Furthermore, similar to the recording above, it can be configured as a recording control signal generating apparatus (formatter) 100 in this case as well, as illustrated in FIG. 8. In the recording control signal generating apparatus 100 in this case, the deflection substrate velocity setting unit 41, within the resist layer on the substrate 15, controls the beam deflection unit 33 so that, for at least a portion of the regions R10 and R12 in which the radial direction distribution of the recording pattern is relatively sparse, latent image formation is performed by dividing the same recording pattern into a plurality of times on that portion; and the recording velocity setting unit 47 sets the tangential direction recording velocity Vexp according to the number of times that latent image formation is performed for the portions (regions R10 and R12) in which latent image formation is performed by dividing the same recording pattern into a plurality of times.

Within the sparse regions R10 and R12, for track c' in which the recording pattern is distributed as portions where multiple latent image formation is performed, the deflection substrate velocity setting unit 41 inclines the exposure beam EB in the radial direction toward track c' in which the recording pattern is distributed each time the exposure beam EB approaches the track b' in which the recording pattern is not distributed, and as a result, latent image formation is performed n times, and when this portion is completed, it returns to the original track b' and continues recording. In this manner, when it approaches a location where blanking is to be performed, it moves to another separate track in the radial direction and performs latent image formation, and as a result, blanking is not performed, and therefore throughput is improved. Also, for the locations R10 and R12 where multiple latent image formation is performed, the tangential direction recording velocity Vexp can be set by the recording velocity setting unit 47 to be relatively faster, assuming multiple formations. As a result, operation can be performed with even greater efficiency.

Furthermore, as a further application of that described above, FIG. 12A, FIG. 12B and FIG. 12C illustrate the case where there are regions in which the number of times of multiple formation is n=4, and regions in which n=2. FIG. 12A is a top view that schematically represents the recording pattern of a track in this variation example; FIG. 12B is an enlarged view of part A extracted from that drawing; FIG. 12C is a drawing of the behavior of FIG. 12A viewed from the side face.

As regions in which multilayer latent image formation is performed n times, in this example there are recording segments R20 and R27 in which n=4, and recording segments R21, R22 and R23 in which n=2, as illustrated in FIG. 12A through FIG. 12C. In recording segments R20 and R27, the recording velocity Vexp by which the desired line width is obtained by normal one-time latent image formation is Vexp3. In this case, because multiple formation is performed four times, this is set by the optimum velocity generating unit 47 to a recording velocity that is four times this, that is, Vexp=4×Vexp3. In recording segments R21, R22 and R23, the recording velocity Vexp by which the desired line width is obtained by normal one-time latent image formation is Vexp2. In this case, because multiple formation is performed twice, this is set by the optimum velocity generating unit 47 to a recording velocity that is twice this, that is, Vexp=2×Vexp2. For recording segments R24, R25 and R26, as regions in which normal one-time latent image formation is performed, the recording velocity Vexp is set to Vexp1 by the optimum velocity generating unit 47. The recording velocities Vexp1, Vexp2 and Vexp3 of each of these segments can be set to be equal, but as described above, they can be set by the optimum velocity generating unit 47 to be mutually different, so that optimum pit recording can be performed, corresponding to various lithography conditions such as resist sensitivity, layer thickness and ambient temperature, or recording conditions such as pit width and track pitch.

Furthermore, as described previously, even if control is performed by increasing or decreasing the tangential direction movement velocity Vsub of the substrate 15 following variations in recording velocity Vexp in order that an inertial force of a predetermined magnitude due to rotation acts on the substrate, there are cases where there is a limit to following these variations, and it cannot necessarily be increased or decreased quickly (mechanical response delay). In this case, for the portions in which it cannot follow the variations, the increase or decrease of the recording velocity Vexp set by the optimum velocity generating unit 47 can be precisely switched and the occurrence of dose deviation can be prevented by inclining the electron beam EB by the beam deflection unit 33.

(2) Expansion to Radial Direction Velocity Control

The above is a case in which the tangential direction recording velocity Vexp is set by the optimum velocity generating unit 47, but this can also be expanded to control of recording velocity in the radial direction.

FIG. 13A and FIG. 13B illustrate an example of such a variation example. FIG. 13B is an explanatory diagram schematically illustrating the track of the substrate 15 that includes recording segments R30-R32, which are contiguous in the radial direction. FIG. 13A is an explanatory diagram illustrating the electron beam (EB) deflection quantity and the like during electron beam recording of segments R30-R32.

As shown in FIG. 13A and FIG. 13B, if it is desired to make the radial direction distribution of the substantially-circular ring-shaped tracks non-uniform, if the radial direction distribution of the tracks is to be sparse (recording segment R31 in this example), the radial direction movement velocity Usub of the substrate 15 and the radial direction recording velocity Uexp must be made relatively faster. If the radial direction distribution is to be dense (recording segments R30 and R32 in this example), the radial direction movement velocity Usub of the substrate 15 and the radial direction recording velocity Uexp must be made relatively slower. Therefore, when it moves from a portion in which the radial direction distribution of the tracks is dense to a portion in which it is sparse (recording segment 31ab in this example), and conversely when it returns to a dense portion (recording segment R32ab in this example), an increase and decrease, respectively, occur in the radial direction movement velocity Usub of the substrate 15.

However, as described above, because an inertial force of a predetermined magnitude due to rotation acts on the substrate 15, even if the increase or decrease of the radial direction movement velocity Usub is controlled in response to the sparsity or density, there are cases where there is a limit to following these variations, and it cannot necessarily be increased or decreased quickly (mechanical response delay). For this reason, there is a portion where tracks exist uniformly in a dense configuration with relatively small gaps, and a portion where tracks exist uniformly in a sparse configuration with relatively large gaps, and between those, there is a portion in which tracks exist with nonuniform gaps (while gradually widening or gradually narrowing).

Thus, in the present variation example, for the portions where it cannot follow (recording segments R31a and R32a), the increase or decrease of the radial direction recording velocity Uexp set by the optimum velocity generating unit 47 can be clearly and precisely switched by inclining (with deflection quantity X, deflection velocity Ubeam) the electron beam EB by the beam deflection unit 33.

FIG. 14 is a flowchart illustrating the control procedure executed by the deflection substrate velocity signal generating unit 41 and the optimum velocity generating unit 47 of the controller 30 for executing the operation described by FIG. 13A and FIG. 13B.

In FIG. 14, in this example, the recording velocity Uexp, the deflection velocity Ubeam of the electron beam (EB) and the substrate velocity Usub are preset before the start of the recording operation for each recording area (recording segment) based on recording data RD. First, in step S105, similar to the step S5, recording data RD is input from the predetermined operating means (or other external device) not shown in the diagrams as described above, into the optimum velocity generating unit 47 and substrate velocity signal generating unit 41.

After that, it moves to step S110, wherein the optimum velocity generating unit 47 judges whether the region whose velocity is to be set thereafter is, for example, a region in which the radial direction distribution of the substantially-circular tracks is relatively sparse (recording segment R31 in the example), or whether it is a normal exposure region (recording segments R30 and R32 in the example). If it is a normal exposure region, the judgment is satisfied and it moves to step S115.

In step S115, the recording velocity is set to the normal value Uexp1 by the optimum velocity generating unit 47, and it moves to step S125.

In step S125, the deflection substrate velocity signal generating unit 41 sets the substrate velocity Usub and the deflection velocity Ubeam to the normal values Usum1 and Ubeam1, respectively.

On the other hand, if in the step S110 the optimum velocity generating unit 47 judged that the region whose velocity is to be set thereafter is, for example, a region in which the radial direction distribution of the substantially-circular tracks is relatively sparse (recording segment R31 in the example), the judgment of step S110 is not satisfied, and it moves to step S140.

In step S140, the optimum velocity generating unit 47 sets the recording velocity to Uexp1−□Uexp, which is increased by □Uexp (□Uexp>0) from the normal value Uexp1, and it moves to step S145.

In step S145, the deflection substrate velocity signal generating unit 41 sets the deflection velocity Ubeam to the normal value Ubeam1, and sets the substrate velocity Usub to Usub1+□U, which is increased by □U (□U>0).

After that, it moves to step S150, wherein the deflection substrate velocity generating unit 41 judges whether the region whose velocity is to be set thereafter is a follow transition region, in which there occurs a mechanical response delay due to the following limit when moving from a region in which the radial direction distribution of the tracks is relatively sparse (recording segment R31 in the example), to a normal exposure region (recording segments R30 and R32 in the example). If it is a normal follow transition region, the judgment is satisfied and it moves to step S155.

In step S155, the optimum velocity generating unit 47 performs predetermined compensation for covering the mechanical response delay for the deflection velocity Ubeam set in step S145.

As described above, when step S125, step S150 and step S155 are completed, it moves to step S135, and the deflection substrate velocity signal generating unit 41 or optimum velocity generating unit 47 judges whether or not velocity setting of the recording region is complete for all of the recording data RD input in step S105. Until it is completed for all data, the judgment of step S135 is not satisfied and it returns to step S110 and repeats the same procedure. When velocity setting has been completed for all data, the judgment of step S135 is satisfied, and the process flow ends.

Furthermore, in the flowchart of FIG. 14, the regions are split into only two classifications: normal regions, and regions in which the recording velocity Uexp is increased because the radial direction distribution of substantially-circular ring-shaped tracks is relatively sparse. However, it is not limited to two classifications. For example, by changing the reference numerals, it can be expanded to regions in which the radial direction distribution of the substantially-circular ring-shaped tracks is relatively dense, and it is also possible to expand this further into many levels depending on degree.

The recording apparatus 10 in the present variation example is a recording apparatus 10 that forms a latent image on a resist layer formed on a substrate 15 by irradiating the resist layer with an exposure beam EB in response to a recording signal while moving the substrate 15, comprising a recording velocity setting unit (optimum velocity generating unit 47 in this example) that variably sets the radial direction recording velocity Uexp in formation of the latent image; a beam deflection unit 33 that moves the irradiation position of the exposure beam EB relative to the substrate 15; substrate velocity adjusting unit 37A and 37B that adjust the radial direction movement velocity of the substrate 15 based on the deflection quantity of the exposure beam EB by the beam deflection unit 33; and a control unit 41 that varies the radial direction deflection velocity Ubeam of the exposure beam EB by the beam deflection unit 33, as well as the radial direction movement velocity Usub of the substrate 15 by the substrate velocity adjusting unit 37A and 37B, in response to variations in the radial direction recording velocity Uexp.

As a result, the radial direction recording velocity Uexp is set to be relatively faster and the radial direction movement velocity Usub of the substrate 15 is set to be relatively faster in the portions in which the radial direction distribution of the substantially-circular ring-shaped tracks is relatively sparse (recording segment R31 in the example), and the radial direction recording velocity Uexp is set to be relatively slower and the radial direction movement velocity Usub of the substrate 15 is set to be relatively slower in the portions in which the radial direction distribution of the substantially-circular ring-shaped tracks is relatively dense (recording segments R30 and R32 in the example), and as a result, the irradiation interruption time of the exposure beam EB on the resist layer can be eliminated (or reduced).

In the recording apparatus 10 in the variation example, the control unit 41 controls either one of or both the radial direction deflection velocity Ubeam of the exposure beam EB by the beam deflection unit 33 and radial direction movement velocity Usub of the substrate by the substrate velocity adjusting unit 37A and 37B, so as to eliminate or reduce the irradiation interruption time of the exposure beam EB on the resist layer.

By eliminating (or reducing) the irradiation interruption time, it is possible to realize a beam recording apparatus having high throughput and no beam current loss.

In the recording apparatus 10 in the variation example, the recording velocity setting unit 47, within the resist layer on the substrate 15, sets the radial direction recording velocity Uexp relatively faster in the sparse region R31, in which the radial direction distribution of substantially-circular ring-shaped tracks where the latent image formation is performed is more (expressed as "relatively" in the present embodiment) sparse than the predetermined condition, than in the dense regions R30 and R32, in which the radial direction distribution of the substantially-circular ring-shaped tracks is more dense than the predetermined condition, and the control unit 41 varies the radial direction movement velocity Usub of the substrate 15 by the substrate velocity adjusting unit 37A and 37B so that it is relatively faster in the sparse region R31, in which the radial direction distribution of the substantially-circular ring-shaped tracks is more sparse than the predetermined condition, than in the dense regions R30 and R32, in which the radial direction distribution of the substantially-circular ring-shaped tracks is more dense than the predetermined condition.

If it is desired to make the radial direction distribution of the substantially-circular ring-shaped tracks where latent image formation is performed non-uniform, the radial direction distribution of the tracks can be made sparse by making the radial direction movement velocity Usub of the substrate 15 and the radial direction recording velocity Uexp relatively faster, and the radial direction distribution of the tracks can be made dense by making the radial direction movement velocity Usub of the substrate 15 and the radial direction recording velocity Uexp relatively slower.

In the recording apparatus 10 in the variation example, the control unit 41 varies the radial direction deflection velocity beam of the exposure beam EB by the beam deflection unit 33 according to the mechanical response delay in response to variations in the movement velocity Usub when the radial direction movement velocity Usub of the substrate 15 by the substrate velocity adjusting unit 37A and 37B varies.

For the portions R31ab and R32ab where it cannot follow (follow transition regions), by varying the radial direction deflection velocity Ubeam of the beam by the beam deflection unit 33 and covering the portions that do not follow sufficiently by inclining the beam EB in the follow direction, the gap portions in which tracks are non-uniform can be eliminated, and the track layout gaps can be made uniform (two types: uniform in the dense regions, uniform in the sparse regions).

Furthermore, similar to the description above, it can be configured as a recording control signal generating apparatus (formatter) 100 in this case as well, as illustrated in FIG. 8. The recording control signal generating apparatus 100 in this case is a recording control signal generating apparatus 100 that generates a control signal for latent image formation, to a beam deflection unit 33 that moves the irradiation position of an exposure beam EB relative to a substrate 15 on top of which a resist layer is formed; to substrate velocity adjusting unit 37A and 37A that adjust the radial direction movement velocity Usub of the substrate 15 based on the deflection quantity of the exposure beam EB by the beam deflection unit 33; and to a recording apparatus that forms a latent image on the resist layer by irradiating the resist layer on the substrate with the exposure beam EB of which the irradiation position is moved by the beam deflection unit 33 while moving the substrate 15 at radial direction movement velocity Usub adjusted by the substrate velocity adjusting unit 37A and 37B; comprising a recording velocity setting unit 47 that variably sets the radial direction velocity Uexp in formation of the latent image, which becomes the reference for control of the radial direction deflection velocity Ubeam of the exposure beam EB by the beam deflection unit 33 in response to the recording signal RD, so as to eliminate or reduce the irradiation interruption time of the exposure beam EB on the resist layer; and an deflection substrate velocity setting unit 41 that generates a control signal to the beam deflection unit 33 and the substrate velocity adjusting unit 37A and 37B, so as to vary the radial direction deflection velocity Ubeam of the exposure beam EB by the beam deflection unit 33 and the radial direction movement velocity Usub of the substrate 15 by the substrate velocity adjusting unit 37A and 37B, in response to the recording signal RD.

As a result, for example, in the portion R31 in which the radial direction distribution of the substantially-circular ring-shaped tracks is relatively sparse, the radial direction recording velocity Uexp is set to be relatively faster by the recording velocity setting unit 47 of the recording control signal generating apparatus 100, and the radial direction movement velocity Usub of the substrate 15 is set to be relatively faster by the deflection substrate velocity setting unit 41; and in the portions R30 and R32 in which the radial direction distribution of the substantially-circular ring-shaped tracks is relatively dense, the radial direction recording velocity Uexp is set to be relatively slower by the recording velocity setting unit 47 of the recording control signal generating apparatus 100, and the radial direction movement velocity Usub of the substrate 15 is set to be relatively slower by the deflection substrate velocity setting unit 41; and as a result, the irradiation interruption time of the exposure beam EB on the resist layer can be eliminated (or reduced).

In the recording control signal generating apparatus 100, the recording velocity setting unit 47, within the resist layer on the substrate 15, sets the radial direction recording velocity Uexp relatively faster in the sparse region R31, in which the radial direction distribution of substantially-circular ring-shaped tracks where the latent image formation is performed is more sparse than the predetermined condition, than in the dense regions R30 and R32, in which the radial direction distribution of the substantially-circular ring-shaped tracks is more dense than the predetermined condition, and the deflection substrate velocity setting unit 41 varies the radial direction movement velocity Usub of the substrate 15 by the substrate velocity adjusting unit 37A and 37B so that it is relatively faster in the sparse region R31, in which the radial direction distribution of the substantially-circular ring-shaped tracks is more sparse than the predetermined condition, than in the dense regions R30 and R32, in which the radial direction distribution of said substantially-circular ring-shaped tracks is more dense than the predetermined condition.

If it is desired to make the radial direction distribution of the substantially-circular ring-shaped tracks where latent image formation is performed non-uniform, the radial direction distribution of the tracks can be made sparse by making the radial direction movement velocity Usub of the substrate 15 and the radial direction recording velocity Uexp relatively faster, and the radial direction distribution of the tracks can be made dense by making the radial direction movement velocity Usub of the substrate 15 and the radial direction recording velocity Uexp relatively slower, by the deflection substrate velocity setting unit 41 and the recording velocity setting unit 47, respectively.

In the recording control signal generating apparatus 100, the deflection substrate velocity setting unit 41 varies the radial direction deflection velocity Ubeam of the exposure beam EB by the beam deflection unit 33 according to the mechanical response delay in response to variations in the movement velocity Usub when the radial direction movement velocity Usub of the substrate 15 by the substrate velocity adjusting unit 37A and 37B varies.

For the portions R31ab and R32ab where it cannot follow, the deflection substrate velocity setting unit 41 varies the beam radial direction deflection velocity Ubeam by the beam deflection unit 33 and covers the portions that do not follow sufficiently by inclining the beam EB in the follow direction. As a result, the gap portions in which tracks are nonuniform can be eliminated, and the track layout gaps can be made uniform (uniform in the dense regions, uniform in the sparse regions and the like).

Furthermore, the example described above is a case where the time constant of the mechanical response delay of the substrate 15 is relatively small (following is completed in a relatively short time), but the present invention is not limited thereto, and can also be applied in the case where the time constant is relatively large.

FIG. 15A and FIG. 15B illustrate a variation example of the case where the time constant is large. FIG. 15B is an explanatory diagram schematically illustrating the track of the substrate 15 that includes recording segments R33-R35, which are contiguous in the radial direction. FIG. 15A is an explanatory diagram illustrating the electron beam (EB) deflection quantity and the like during electron beam recording of segments R33-R35.

In FIG. 15A and FIG. 15B, when it moves from a portion in which the radial direction distribution of the tracks is dense (recording segment R33 in this example) to a portion in which it is sparse (recording segment R34 in this example), and conversely when it returns to a dense portion (recording segment R35 in this example), an increase and decrease, respectively, occur in the radial direction movement velocity Usub of the substrate 15.

In this example, the time constant of following is large in the case where control is performed so as the increase or decrease the radial direction movement velocity Usub in response to sparsity or density, and therefore the mechanical response delay in changes in the movement velocity Usub of the substrate 15 is large (in this example, because control in the reverse direction starts as soon as following is complete, almost all of the recording segment 34 becomes follow transition regions 34a and 34b; similarly for regions R33b and R35a of recording segments R33 and R35), and the radial direction deflection velocity Ubeam of the exposure beam EB by the beam deflection unit 33 must be varied a great deal. That is, in the portions R33b, R34a, R34b and R35a where it cannot follow (follow transition regions), the radial direction deflection velocity Ubeam of the beam is varied a great deal by the beam deflection unit 33, and the beam EB is inclined in the follow direction, and as a result, those portions can be covered.

The above description was given using as an example a beam recording apparatus using an Xθ stage system, but this is not a limitation, and the present invention can also be applied to a beam recording apparatus provided with an XY stage system.

Further, a beam recording apparatus using an electron beam was described above, but the present invention can also be applied to a laser beam recording apparatus provided with an deflection apparatus or other electrically charged particle beam recording apparatus.

The recording apparatus 10 in the embodiment is a recording apparatus 10 that forms a latent image on a resist layer formed on a substrate 15 by irradiating the resist layer with an exposure beam EB in response to a recording signal while moving the substrate 15, comprising an optimum velocity generating unit 47 that variably sets the tangential direction recording velocity Vexp in formation of the latent image; a beam deflection unit that moves the irradiation position of the exposure beam EB relative to the substrate 15; a rotation drive unit 37A and movement drive unit 37B that adjust the tangential direction movement velocity Vsub of the substrate 15 based on the deflection quantity of the exposure beam EB by the beam deflection unit 33; and an deflection substrate velocity signal generating unit 41 that varies the tangential direction deflection velocity Vbeam of the exposure beam EB by the beam deflection unit 33, as well as the tangential direction movement velocity Vsub of the substrate 15 by the substrate velocity adjusting unit 37A and 37B, in response to variations in the tangential direction recording velocity Vexp.

As a result, the tangential direction movement velocity Vsub of the substrate 15 and the tangential direction deflection velocity Vbeam of the exposure beam EB are made relatively faster in the recording segment R2, in which the tangential direction distribution of the recording pattern is relatively sparse, and the tangential direction movement velocity Vsub of the substrate 15 and the tangential direction deflection velocity Vbeam of the exposure beam EB are made relatively slower in the recording segments R1 and R3, in which the tangential direction distribution of the recording pattern is relatively dense, and as a result, blanking by the blanking control unit 31 with respect to the exposure beam EB can be eliminated (or reduced).

The recording signal generating apparatus 100 in the embodiment is a recording signal generating apparatus 100 that generates a control signal for latent image formation, to a beam deflection unit 33 that moves the irradiation position of an exposure beam EB relative to a substrate 15 on top of which a resist layer is formed; to a rotation drive unit 37A and movement drive unit 37B that adjust the tangential direction movement velocity Vsub of the substrate based on the deflection quantity of the exposure beam EB by the beam deflection unit 33; and to a recording apparatus that forms a latent image on the resist layer by irradiating the resist layer on the substrate with the exposure beam EB of which the irradiation position is moved by the beam deflection unit 33 while moving the substrate 15 at tangential direction movement velocity Vsub adjusted by the rotation drive unit 37A and movement drive unit 37B; comprising an optimum velocity generating unit 47 that variably sets the tangential direction velocity Vexp in formation of the latent image, which becomes the reference for control of the tangential direction deflection velocity Vbeam of the exposure beam EB by the beam deflection unit 33 in response to the recording signal RD, so as to eliminate or reduce the irradiation interruption time of the exposure beam EB on the resist layer; and an deflection substrate velocity signal generating unit 41 that generates a control signal to the beam deflection unit 33 and the rotation drive unit 37A and movement drive unit 37B, so as to vary the tangential direction deflection velocity Vbeam of the exposure beam EB by the beam deflection unit 33 and the tangential direction movement velocity Vsub of the substrate 15 by the rotation drive unit 37A and movement drive unit 37B, in response to variations in the tangential direction recording velocity Vexp.

The recording control signal generating apparatus 100 is equipped with an deflection substrate velocity signal generating unit 41 and an optimum velocity generating unit 47. The deflection substrate velocity signal generating unit 41 varies the deflection velocity Vbeam of the exposure beam EB by the beam deflection unit 33 and the movement velocity Vsub of the substrate 15 by the rotation drive unit 37A and movement drive unit 37B, in response to the recording velocity Vexp at the time of latent image formation that is variably set by the optimum velocity generating unit 47. As a result, the tangential direction movement velocity Vsub of the substrate 15 and the tangential direction deflection velocity Vbeam of the exposure beam EB are made relatively faster in the portion R2, in which the tangential direction distribution of the recording pattern is relatively sparse, and the tangential direction movement velocity Vsub of the substrate 15 and the tangential direction deflection velocity Vbeam of the exposure beam EB are made relatively slower in the portions R1 and R3, in which the tangential direction distribution of the recording pattern is relatively dense, and as a result, the irradiation interruption time of the exposure beam EB on the resist layer can be eliminated (or reduced).

The electron beam recording apparatus 10 and the record control signal generating apparatus 100 for manufacturing a master disk on which is formed a recording pattern of an optical disk have been described, but the present embodiment can also be applied when manufacturing so-called discrete track media or pattern record media in which the recorded magnetic substrates are spatially separated.

In other words, in the above description, a pattern recording method using the electron beam recording apparatus 10 was described for manufacturing groove shapes on discrete track media or dot shapes on pattern record media.

The electron beam recording apparatus 10 described above is an X-θ type electron beam recording apparatus that comprises a mechanism (corresponding to the X stage 18, and the like) for moving the substrate to which a resist is applied (corresponding to the substrate 15) and a rotating stage (corresponding to the turntable 16) for rotating the substrate, and that performs recording by irradiating an exposure beam on the resist.

Using this electron beam recording apparatus 10, a dot pattern is formed by depicting at set intervals while rotating and simultaneously moving the stage in the radius direction. On this occasion, it is possible to provide a spiral dot string without deflecting the electron beam during rotations, but as is disclosed in JP, A, 2002-367241, it is also possible to depict concentric dot strings by performing print by lithography with gradually varying the deflection amount of the electron beam in a saw tooth pattern so as to depict a concentric circle on the resist in a single rotation. Besides dot patterns for data, it is also possible to create areas to which servo patterns are provided for extracting addresses or controlling track position.

Ordinarily, patterned magnetic recording media are called hard disks or patterned media, or patterned hard disks. The patterned magnetic recording medium 80 shown in FIG. 16 can be divided into a servo pattern part 81 and a patterned data track part 82. Note that in the example in the drawing, the dot pattern of the data track part 82 is only shown in the outer circumference and inner circumference parts, but the drawing is deformed and abbreviated, and in actuality the dot pattern of the data track part 82 is present over the entire effective radius of the disk. The servo pattern part 81 is also present in parts other than those shown in the drawing.

A swinging arm head 83 is constituted so as to be swingable in the radius direction of a magnetic recording medium 80, and reads and writes data recorded on magnetic recording areas of the magnetic recording medium 80.

In the data track part 82, a recording medium pattern of a dot string arranged in a concentric circle is formed. A square-shaped pattern indicating address information and track detection information, a line-shaped pattern extending in the radius direction and cutting across the track for extracting clock timing, and so on are formed in the servo pattern part 81. The servo pattern part 81 has the same pattern as current hard disk recording media, but it is also possible to adopt a pattern shape or feature different from current hard disk media by adopting a servo pattern with a new format optimized for the patterned media.

It is necessary to depict with differing recording pattern densities in the various areas in order to form patterns in the servo pattern part 81 and the data track part 82 using the electron beam recording apparatus 10. In a case in which a pattern is formed using conventional blanking, the length (time) of blanking per unit length (time) in the tangential direction differs between the servo pattern part 81 and the data track part 82. For example, if the tangential direction in the servo pattern part 81 has 40% blanking, and the data track part 82 has 60% blanking, the servo pattern part 81 is relatively denser in the tangential direction and the data track part 82 is relatively sparser in the tangential direction. Therefore, pattern formation is possible by the outline in the (B-1) When recording velocity is constant (refer to FIG. 5A) or (B-2) When recording velocity is variable (refer to FIG. 5B) of (B) Basic Behavior of the Present Embodiment.

However, this does not negate the applicability of the modifications described above. Neither does this negate performing record control corresponding to the various densities of the area indicating the track address in the control signal part, the area in which the track servo signal is obtained, the area for extracting the recording playback clock, and other finer areas.

Next, an imprint mold (mold) manufacturing method for imprinting used in manufacturing pattern recording media is described.

1. Manufacturing Method for an Imprint Mold (So-Called Mold) for Imprinting

This manufacturing method constitutes the first half of a method for manufacturing a pattern recording medium by using a resist mask to first manufacture an imprint mold for imprinting, and then using this imprint mold for imprinting to perform transcription. The manufacturing method for a pattern recording medium using this imprinting method has high mass-production efficiency and can be used in a mass-production process since there is no need for recording or print by lithography for every individual medium compared to a method for directly etching a record coat layer (record material) formed on a base substrate for a magnetic recording medium.

<Manufacturing Method for an Imprint Mold for Imprinting>

The present example of application describes a specific example of a manufacturing method for an imprint mold for imprinting. Note that in the present example of application; the imprint mold for imprinting is manufactured using the electron beam recording apparatus 10. This example of application is an embodiment for manufacturing a patterned magnetic recording medium as an example of the magnetic recording media manufactured by this imprint mold for imprinting.

FIG. 17 to FIG. 22 show cross-section diagrams of one example of manufacturing the imprint mold for imprinting by using the present example of application.

First, a glass or silicon (SI) wafer of an appropriate size is prepared as a substrate 71. Next, as shown in FIG. 17, a resist material needed for patterning is formed in a coat on the substrate 71 by spin coating or a similar method. In the present example of application, an electron beam resist film 72 is formed in order to perform print by lithography using the electron beam recording apparatus 10. Next, the electron beam resist film 72 is pre-baked as needed.

Next, the electron beam recording apparatus 10 according to the above embodiment depicts by exposing using the electron beam as shown in FIG. 18, forming a latent image 72A on the electron beam resist film 72 (latent image formation). Next, post-exposure baking (PEB) is performed as needed. When the electron beam resist film 72 is developed, a groove part 72b is formed on the electron beam resist film 72 as shown in FIG. 19. Thereafter, the electron beam resist film 72 is post-baked as needed.

Next, a nickel alloy film 73 is formed on the electron beam resist film 72 and the substrate 71 surface by sputtering nickel as an initial conductive film as shown in FIG. 20 using a sputtering apparatus which is not shown.

Next, a nickel layer 74 (imprint mold base) is formed on the surface of the nickel alloy film 73 by performing electro-forming (electrical plating) using the nickel alloy film 73 as an electrode as shown in FIG. 21. A master stamper 74A (imprint mold for imprinting) of nickel and the like, is obtained as shown in FIG. 22 by releasing the nickel layer 74 from the substrate 71. At this point, the surface of the master stamper 74A is washed as needed.

The method of manufacturing the imprint mold 74A (master stamper) in the application example of an embodiment comprises the steps of recording velocity setting, which variably sets the recording velocity Vexp and Uexp in formation of a latent image to be formed by irradiation of an electron beam EB on a resist layer on a substrate 15 while moving the substrate 15 (17); beam deflection, which moves the irradiation position of the exposure beam EB relative to the substrate 15; substrate velocity adjusting, which adjusts the movement velocity Vsub and Usub of the substrate; controlling, which varies the exposure beam EB deflection velocity Vbeam and Ubeam and the movement velocity Vsub and Usub of the substrate in response to variations in the recording velocity Vexp and Uexp; latent image forming, which forms a latent image 72a on the resist layer 72; and imprint mold forming, which transfers the latent image and forms an imprint mold 74A having a concave and convex form.

Also, the imprint mold 74A (master stamper) in the application example of an embodiment is manufactured by a method of manufacturing an imprint mold, the method comprising the steps of recording velocity setting, which variably sets the recording velocity Vexp and Uexp in formation of a latent image 72a to be formed by irradiation of an electron beam EB on a resist layer 72 on a substrate 15 while moving the substrate 15; beam deflection, which moves the irradiation position of the exposure beam EB relative to the substrate 15; substrate velocity adjusting, which adjusts the movement velocity Vsub and Usub of the substrate 15; controlling, which varies the deflection velocity Vbeam and Ubeam of the exposure beam EB and the movement velocity Vsub and Usub of the substrate in response to variations in the recording velocity Vexp and Uexp; latent image forming, which forms a latent image 72a on the resist layer 72; and imprint mold forming, which transfers the latent image 72a and forms an imprint mold 74A having a concave and convex form 72b.

<Another Manufacturing Method for an Imprint Mold for Imprinting>

FIG. 23 to FIG. 27 show cross-section diagrams of one example of manufacturing the imprint mold for imprinting according to another mode of the present example of application. Note that FIG. 23 to FIG. 27 show manufacturing processes which substitute that shown in FIG. 20 to FIG. 22 respectively.

When the groove part 72B is formed on the electron beam resist film 72 as shown in FIG. 19, the substrate 71 (substrate material) as shown in FIG. 23 is etched using the resist pattern constituted by the electron beam resist film 72 as shown in FIG. 19 as the master. Next, the remaining electron beam resist film 72 is removed using oxygen plasma ashing, thus exposing the substrate 71 as shown in FIG. 24.

Next, a nickel alloy film 73 is formed on the exposed substrate 71 surface by sputtering nickel as an initial conductive film as shown in FIG. 25 using a sputtering apparatus, and the like, which is not shown. Next, a nickel layer 74 is formed on the surface of the nickel alloy film 73 by performing electro-forming (electrical plating) using the nickel alloy film 73 as an electrode as shown in FIG. 26. A master stamper 74A (imprint mold for imprinting) of nickel and the like, is obtained as shown in FIG. 27 by releasing the nickel layer 74 from the substrate 71. At this point, the surface of the master stamper 74A is washed as needed.

Meanwhile, the imprint mold for imprinting and imprinted replica according to the present embodiment are effective for super minute patterns corresponding to extremely high surface recording density such as density of over 500 Gbpsi (Gbit/inch$^2$), in particular 1-10 Tbpsi. Specifically, by using an imprint mold which has approximately 25 nm pit interval patterns, it is possible to manufacture high density patterned media from the replica, of which the recording density is over approximately 1 Tbpsi.

To realize this, it is preferable to use the electron beam recording apparatus 10, and the like, which is capable of forming super-fine patterns, as a manufacturing method for a mask in which are formed concave and convex parts, in the manufacturing method of the imprint mold of the example of application.

<Manufacture of a Patterned Magnetic Recording Medium>

Next, an example of manufacturing a patterned recording medium using an imprint apparatus is described.

FIG. 28 to FIG. 31 are cross-section diagrams showing an example of a manufacturing method for a patterned magnetic recording medium.

The process for manufacturing the patterned magnetic recording medium comprises the steps of: forming a replica, imprinting, etching, filling a non-magnetic material, and forming a protective film (lubrication film), and these steps are performed in sequence.

First, in the replica forming process, a base substrate (corresponding to a substrate 116 described below) for a magnetic recording medium which consists of a special chemically reinforced glass, a SI wafer, an aluminum plate, and other materials is prepared.

Next, a recording film layer 101 is formed on the substrate 116 as shown in FIG. 28 using sputtering, and the like Note that in a case of manufacturing a perpendicular magnetic recording medium, the recording film layer 101 is a laminated structure of a soft magnetic foundation layer, an intermediate layer, a hard magnetic recording layer, and so on.

Further, a metal mask layer 101 of TA, TI, or the like, is formed on the recording film layer 102 by sputtering as shown in FIG. 28, and a substrate 3 is formed. Further, a thermoplastic resin resist such as polymethyl methacrylate resin (PMMA) is formed on the metal mask layer 102 as transfer material 202 by spin coating or the like.

Next, in the imprinting process, as shown in FIG. 29, the imprint mold 74A is set on an imprint apparatus 202 which is not shown, such that the concave and convex surface faces the transfer material 202. That is, the imprint mold 74A is set and supported by a mold holding mechanism which is not shown.

In the imprint apparatus, which is not shown, a work chamber (not shown) is decompressed as needed. Thereafter, in the imprint apparatus, the transfer material 202 is heated as needed until it possesses flowability, and is then pressed. For example, the glass transition point of polymethyl methacrylate resin (PMMA) is approximately 100° C.; therefore, the imprint apparatus heats the transfer material 200 to 120-200° C. (for example, approximately 160° C.) to make it flowable, and then presses the imprint mold 74A with a pressing force of 1-10000 kPa (for instance, approximately 1000 kPa) into the substrate 3. At this point, it is preferable to ensure the inside of the work chamber to be a vacuum state such that the attained degree of vacuum is lower than or equal to several hundred Pa (for example, approximately 10 Pa), because degasification occurs due to the remains of the solvent used when applying the transfer material 202, the moisture in the resin, and so on.

Next, by resuming the atmosphere in the work chamber to original state and releasing the imprint mold 74A, a replica 217 in which the concave and convex pattern of the imprint mold 74A are transferred onto the transfer material 202, as shown in FIG. 74A, is manufactured. The imprinting process is thus complete.

Next, in the etching process, any unnecessary transfer material 202 as the etching mask is removed by soft ashing using $O_2$ gas, or the like as shown in FIG. 31. Next, as shown in FIG. 32, the metal mask 102 is etched using $CHF_3$ gas, or the like, with the transfer material 202 as the etching mask.

Next, as shown in FIG. 33, the remaining transfer material 202 is removed by a wet process or a dry ashing process using $O_2$ gas. The recording film layer 101 is then dry-etched using AR gas, or the like, with the metal mask layer 102 as an etching mask, as shown in FIG. 34. Next, the remaining metal mask layer 102 is removed by a wet process or dry etching process, as shown in FIG. 35.

Next, in the non-magnetic material filling process, a material (in a case of a magnetic recording medium, a non-magnetic material 104 such as $SiO_2$, or the like) which is not a recording material as shown in FIG. 36 is filled in the groove parts of the patterns by sputtering or coating process.

Next, as shown in FIG. 37, the surface of the non-magnetic material 104 is polished and evened by etching back or chemical polishing. It is thus possible to achieve a structure in which the recording material is separated from the non-recording material 104.

Next, in the protective film (lubricating film) formation process, as shown in FIG. 38, a pattern recording medium is accomplished by forming a protective film 105 or lubricating film 106 of the recording film layer 101 on the face by coating or dipping, for example. In addition, by incorporating this pattern recording medium into a hard disc drive housing, pattern media in which this pattern recording medium is incorporated into this hard disc drive housing can be configured. A patterned magnetic recording medium can be manufactured via the process.

The magnetic disc (patterned magnetic recording medium) in the application example of an embodiment is manufactured by a method of manufacturing magnetic disc, the method comprising the steps of recording velocity setting, which variably sets the recording velocity Vexp and Uexp in formation of a latent image to be formed by irradiation of an electron beam EB on a resist layer on a substrate 15 while moving the substrate 15; beam deflection, which moves the irradiation position of the exposure beam EB relative to the substrate 15; substrate velocity adjusting, which adjusts the movement velocity Vsub and Usub of the substrate 15; controlling, which varies the exposure beam EB deflection velocity Vbeam and Ubeam and the movement velocity Vsub and Usub of the substrate in response to variations in the recording velocity Vexp and Uexp; latent image forming, which forms a latent image 72a on the resist layer 72; imprint mold forming, which transfers the latent image 72a and forms an imprint mold 74A having a concave and convex form 72b; imprinting, which imprints the concave and convex form onto a base substrate 116 used for a magnetic recording medium by pressing the imprint mold 74A against the transfer material 202; and replica forming, which removes the imprint mold 74A and forms a replica having the concave and convex form.

2. Manufacturing Method for a Patterned Medium Using Direct Recording

The patterned magnetic recording medium can be manufactured by creating a latent image depicted and exposed using the above pattern creation method, and etching the direct recording material using a resist mask formed by developing the latent image.

FIG. 39 to FIG. 41 are cross-section diagrams showing an example of a manufacturing method for a patterned magnetic recording medium. FIG. 39 to FIG. 41 constitute part of the replica forming process described above (corresponding to FIG. 28 to FIG. 30 described above).

First, in the replica forming process, as in the replica forming process described above, a recording film layer 101 is formed on a substrate 116 for a magnetic recording medium, which consists of a special chemically reinforced glass, a Si wafer, an aluminum plate, and other materials.

Furthermore, a metal mask 101 of Ta, Ti, or the like is formed on the recording film layer 102 by sputtering, or the like, and a substrate 3 is formed. Further, an electron beam resist film 72 is formed on the metal mask layer 102 as a resist material needed for patterning using spin coating, or the like this electron beam resist film 72 is pre-baked as needed.

Next, the electron beam recording apparatus 10 performs recording on the electron beam resist film 72. What the electron beam recording apparatus 10 depicts on the electron beam resist film 72 at this occasion is a predetermined pattern corresponding to a pattern to be formed on a magnetic substrate in the data track part 82 shown in FIG. 16. The electron beam resist film 72 on which the predetermined pattern shown in FIG. 40 has been formed is post-exposure baked as needed.

Next, the pattern is formed by developing the electron beam resist film 72 as shown in FIG. 41. Note that the electron beam resist film 72 in which the pattern is formed is post-baked as needed. The processes after this are the same as the etching process, the non-magnetic material filling process, and the protective film (lubricating film) forming process shown in FIG. 31 to FIG. 38, substituting the transfer material 202 shown in FIG. 31 and FIG. 31 for the electron beam resist film 72.

What is claimed is:

1. A recording apparatus that forms a latent image on a resist layer on a substrate by irradiating said resist layer with an exposure beam, comprising:
   a recording velocity setting unit that variably sets the recording velocity in formation of said latent image;
   a beam deflection unit that moves the irradiation position of said exposure beam relative to said substrate;
   a substrate velocity adjusting unit that adjusts the movement velocity of said substrate; and
   a control unit that varies the deflection velocity of said exposure beam by said beam deflection unit, as well as the movement velocity of said substrate by said substrate velocity adjusting unit, in response to variations in said recording velocity; wherein:

said control unit varies the movement velocity of said substrate in a predetermined direction by said substrate velocity adjusting unit so that it is relatively faster in the sparse regions in which the distribution of a recording pattern in said predetermined direction is more sparse than a predetermined condition, than in the dense regions in which the distribution of said recording pattern in said predetermined direction is more dense than said predetermined condition.

2. The recording apparatus according to claim 1, wherein: said recording velocity setting unit sets said recording velocity in the tangential direction to substantially constant in the normal exposure regions; and varies the tangential direction movement velocity of said substrate by said substrate velocity adjusting unit so that it is relatively faster, and varies the tangential direction deflection velocity of said exposure beam by said beam deflection unit so that it is relatively faster in the sparse regions, in which the tangential direction distribution of the recording pattern is more sparse than a predetermined condition, than in the dense regions, in which the tangential direction distribution of the recording pattern is more dense than said predetermined condition.

3. The recording apparatus according to claim 1, wherein: said recording velocity setting unit sets, within said resist layer on said substrate, said recording velocity in the radial direction relatively faster in the sparse regions, in which the radial direction distribution of substantially-circular ring-shaped tracks where said latent image formation is performed is more sparse than said predetermined condition, than in the dense regions, in which the radial direction distribution of said substantially-circular ring-shaped tracks is more dense than said predetermined condition, and said control unit varies the radial direction movement velocity of said substrate by said substrate velocity adjusting unit so that it is relatively faster in the sparse regions, in which the radial direction distribution of said substantially-circular ring-shaped tracks is more sparse than said predetermined condition, than in the dense regions, in which the radial direction distribution of said substantially-circular ring-shaped tracks is more dense than said predetermined condition.

4. A recording apparatus that forms a latent image on a resist layer on a substrate by irradiating said resist layer with an exposure beam, the recording apparatus comprising:
a recording velocity setting unit that variably sets the recording velocity in formation of said latent image;
a beam deflection unit that moves the irradiation position of said exposure beam relative to said substrate;
a substrate velocity adjusting unit that adjusts the movement velocity of said substrate; and
a control unit that varies the deflection velocity of said exposure beam by said beam deflection unit, as well as the movement velocity of said substrate by said substrate velocity adjusting unit, in response to variations in said recording velocity; wherein:
said control unit controls, within said resist layer on said substrate, said beam deflection unit so that, for at least a portion of the regions in which the radial direction distribution of the recording pattern is relatively sparse, latent image formation is performed by overlapping the same recording pattern into a plurality of times on that portion; and
said recording velocity setting unit sets said tangential direction recording velocity according to the number of times said latent image formation is performed for the portion in which said latent image formation is performed by overlapping the same recording pattern into a plurality of times.

5. The recording apparatus according to claim 1, wherein: said recording velocity is the velocity in the tangential direction or radial direction of said substrate.

6. The recording apparatus according to claim 1, wherein: said control unit controls either one of or both the tangential direction or radial direction deflection velocity of said exposure beam by said beam deflection unit and tangential direction or radial direction movement velocity of said substrate by said substrate velocity adjusting unit, so as to eliminate or reduce the irradiation interruption time of said exposure beam on said resist layer.

7. The recording apparatus according to claim 3, wherein: said control unit varies the radial direction deflection velocity of said exposure beam by said beam deflection unit according to the mechanical response delay in response to variations in said movement velocity when the radial direction movement velocity of said substrate by said substrate velocity adjusting unit varies.

8. A recording control signal generating apparatus that forms a latent image on a resist layer on a substrate by irradiating said resist layer with an exposure beam, comprising:
a recording velocity setting unit that variably sets the recording velocity in formation of said latent image, which is the basis for controlling the deflection velocity of said exposure beam, so as to eliminate or reduce the irradiation interruption time of said exposure beam on said resist layer, and
a deflection/substrate velocity setting unit that generates a recording control signal that varies the deflection velocity of said exposure beam and the movement velocity of said substrate in response to variations in said recording velocity; wherein:
said recording velocity setting unit sets said recording velocity in the tangential direction to substantially constant in the normal exposure regions; and
said deflection/substrate velocity setting unit varies, within said normal exposure regions, the tangential direction movement velocity of said substrate by said substrate velocity adjusting unit so that it is relatively faster, and varies the tangential direction deflection velocity of said exposure beam by said beam deflection unit so that it is relatively faster in the sparse regions, in which the tangential direction distribution of the recording pattern is relatively sparse, than in the dense regions, in which the tangential direction distribution of the recording pattern is relatively dense.

9. A recording control signal generating apparatus that forms a latent image on a resist layer on a substrate by irradiating said resist layer with an exposure beam, comprising:
a recording velocity setting unit that variably sets the recording velocity in formation of said latent image, which is the basis for controlling the deflection velocity of said exposure beam, so as to eliminate or reduce the irradiation interruption time of said exposure beam on said resist layer, and
a recording control signal generating unit that generates a recording control signal that varies the deflection velocity of said exposure beam and the movement velocity of said substrate in response to variations in said recording velocity; wherein:
said deflection/substrate velocity setting unit, within said resist layer on said substrate, controls said beam deflection unit so that, for at least a portion of the regions in which the radial direction distribution of the recording pattern is relatively sparse, latent image formation is performed by overlapping the same recording pattern into a plurality of times on that portion; and said recording velocity setting unit sets said recording velocity in the tangential direction according to the number of times said latent image formation is performed for the portion in which said latent image formation is performed by overlapping the same recording pattern into a plurality of times.

10. A recording control signal generating apparatus that forms a latent image on a resist layer on a substrate by irradiating said resist layer with an exposure beam, comprising:

a recording velocity setting unit that variably sets the recording velocity in formation of said latent image, which is the basis for controlling the deflection velocity of said exposure beam, so as to eliminate or reduce the irradiation interruption time of said exposure beam on said resist layer, and a recording control signal generating unit that generates a recording control signal that varies the deflection velocity of said exposure beam and the movement velocity of said substrate in response to variations in said recording velocity; wherein:

said recording velocity setting unit sets, within said resist layer on said substrate, said recording velocity in the radial direction relatively faster in the sparse regions, in which the radial direction distribution of substantially-circular ring-shaped tracks where said latent image formation is performed is more sparse than said predetermined condition, than in the dense regions, in which the radial direction distribution of said substantially-circular ring-shaped tracks is more dense than said predetermined condition, and said deflection/substrate velocity setting unit varies the radial direction movement velocity of said substrate so that it is relatively faster in the sparse regions, in which the radial direction distribution of said substantially-circular ring-shaped tracks is more sparse than said predetermined condition, than in the dense regions, in which the radial direction distribution of said substantially-circular ring-shaped tracks is more dense than said predetermined condition.

11. The recording control signal generating apparatus according to claim 8, wherein:

said recording velocity is the velocity in the tangential direction or radial direction of said substrate.

12. The recording control signal generating apparatus according to claim 8, wherein:

said recording control signal includes a beam deflection control signal that moves the irradiation position of the exposure beam; and a substrate velocity control signal that adjusts the movement velocity of said substrate.

13. The recording control signal generating apparatus according to claim 10, wherein:

said deflection/substrate velocity setting unit varies the radial direction deflection velocity of said exposure beam by said beam deflection unit according to the mechanical response delay in response to variations in said movement velocity when the radial direction movement velocity of said substrate varies.

14. A method of manufacturing an imprint mold, comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam relative to said substrate;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer; and an imprint mold forming step, which transfers said latent image and forms an imprint mold having a concave and convex form; wherein:

in said recording velocity setting step, said recording velocity in the tangential direction is set to substantially constant in the normal exposure regions; and in said controlling step, within said normal exposure regions, the tangential direction movement velocity of said substrate in said substrate velocity adjusting step is varied so that it is relatively faster, and the tangential direction deflection velocity of said exposure beam in said beam deflection step is varied so that it is relatively faster in the sparse regions, in which the tangential direction distribution of the recording pattern is more sparse than a predetermined condition, than in the dense regions, in which the tangential direction distribution of the recording pattern is more dense than said predetermined condition.

15. An imprint mold manufactured by an imprint mold manufacturing method, said imprint mold manufacturing method comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer; and an imprint mold forming step, which transfers said latent image and forms an imprint mold having a concave and convex form; wherein:

in said recording velocity setting step, said recording velocity in the tangential direction is set to substantially constant in the normal exposure regions; and in said controlling step, within said normal exposure regions, the tangential direction movement velocity of said substrate in said substrate velocity adjusting step is varied so that it is relatively faster, and the tangential direction deflection velocity of said exposure beam in said beam deflection step is varied so that it is relatively faster in the sparse regions, in which the tangential direction distribution of the recording pattern is more sparse than a predetermined condition, than in the dense regions, in which the tangential direction distribution of the recording pattern is more dense than said predetermined condition.

16. A magnetic disc manufactured by a magnetic disc manufacturing method, said magnetic disc manufacturing method comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer;

an imprint mold forming step, which transfers said latent image and forms an imprint mold having a concave and convex form;

an imprinting step, which imprints said concave and convex form onto a base substrate used for a magnetic recording medium by pressing said imprint mold against it; and a replica forming step, which removes said imprint mold and forms a replica having said concave and convex form; wherein:

in said recording velocity setting step, said recording velocity in the tangential direction is set to substantially constant in the normal exposure regions; and in said controlling step, within said normal exposure regions, the tangential direction movement velocity of said substrate in said substrate velocity adjusting step is varied so that it is relatively faster, and the tangential direction deflection velocity of said exposure beam in said beam deflection step is varied so that it is relatively faster in the sparse regions, in which the tangential direction distribution of the recording pattern is more sparse than a predetermined condition, than in the dense regions, in which the tangential direction distribution of the recording pattern is more dense than said predetermined condition.

17. A method of manufacturing an imprint mold, said method comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam relative to said substrate;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer; and an imprint mold forming step, which transfers said latent image and forms an imprint mold having a concave and convex form; wherein:

in said controlling step, within said resist layer on said substrate, said beam deflection step is controlled so that, for at least a portion of the regions in which the radial direction distribution of the recording pattern is relatively sparse, latent image formation is performed by overlapping the same recording pattern into a plurality of times on that portion; and in said recording velocity setting step, said tangential direction recording velocity is set according to the number of times said latent image formation is performed for the portion in which said latent image formation is performed by overlapping the same recording pattern into a plurality of times.

18. An imprint mold manufactured by a method of manufacturing an imprint mold, said method comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer; and an imprint mold forming step, which transfers said latent image and forms an imprint mold having a concave and convex form; wherein:

in said controlling step, within said resist layer on said substrate, said beam deflection step is controlled so that, for at least a portion of the regions in which the radial direction distribution of the recording pattern is relatively sparse, latent image formation is performed by overlapping the same recording pattern into a plurality of times on that portion; and in said recording velocity setting step, said tangential direction recording velocity is set according to the number of times said latent image formation is performed for the portion in which said latent image formation is performed by overlapping the same recording pattern into a plurality of times.

19. A magnetic disc manufactured by a method of manufacturing a magnetic disc, said method comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer;

an imprint mold forming step, which transfers said latent image and forms an imprint mold having a concave and convex form;

an imprinting step, which imprints said concave and convex form onto a base substrate used for a magnetic recording medium by pressing said imprint mold against it; and a replica forming step, which removes said imprint mold and forms a replica having said concave and convex form; wherein:

in said controlling step, within said resist layer on said substrate, said beam deflection step is controlled so that, for at least a portion of the regions in which the radial direction distribution of the recording pattern is relatively sparse, latent image formation is performed by overlapping the same recording pattern into a plurality of times on that portion; and in said recording velocity setting step, said tangential direction recording velocity is set according to the number of times said latent image formation is performed for the portion in which said latent image formation is performed by overlapping the same recording pattern into a plurality of times.

20. A method of manufacturing an imprint mold, said method comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam relative to said substrate;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer; and an imprint mold forming step, which transfers said latent image and forms an imprint mold having a concave and convex form; wherein:

in said recording velocity setting step, within said resist layer on said substrate, said recording velocity in the radial direction is set to be relatively faster in the sparse regions, in which the radial direction distribution of substantially-circular ring-shaped tracks where said latent image formation is performed is more sparse than said predetermined condition, than in the dense regions, in which the radial direction distribution of said substantially-circular ring-shaped tracks is more dense than said predetermined condition, and in said controlling step, the radial direction movement velocity of said substrate by said substrate velocity adjusting step is varied so that it is relatively faster in the sparse regions, in which the radial direction distribution of said substantially-circular ring-shaped tracks is more sparse than said predetermined condition, than in the dense regions, in which the radial direction distribution of said substantially-circular ring-shaped tracks is more dense than said predetermined condition.

21. An imprint mold manufactured by a method of manufacturing an imprint mold, said method comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer; and an imprint mold forming step, which transfers said latent image and forms an imprint mold having a concave and convex form; wherein:

in said recording velocity setting step, within said resist layer on said substrate, said recording velocity in the radial direction is set to be relatively faster in the sparse regions, in which the radial direction distribution of substantially-circular ring-shaped tracks where said latent image formation is performed is more sparse than said predetermined condition, than in the dense regions, in which the radial direction distribution of said substantially-circular ring-shaped tracks is more dense than said predetermined condition, and in said controlling step, the radial direction movement velocity of said substrate by said substrate velocity adjusting step is varied so that it is relatively faster in the sparse regions, in which the radial direction distribution of said substantially-circular ring-shaped tracks is more sparse than said predetermined condition, than in the dense regions, in which the radial direction distribution of said substantially-circular ring-shaped tracks is more dense than said predetermined condition.

22. A magnetic disc manufactured by a method of manufacturing a magnetic disc, said method comprising:

a recording velocity setting step, which variably sets the recording velocity in formation of a latent image to be formed by irradiation of an exposure beam on a resist layer on a substrate while moving said substrate;

a beam deflection step, which moves the irradiation position of said exposure beam;

a substrate velocity adjusting step, which adjusts the movement velocity of said substrate;

a controlling step, which varies the deflection velocity of said exposure beam and the movement velocity of said substrate in response to variations in said recording velocity;

a latent image forming step, which forms a latent image on said resist layer;

an imprint mold forming step, which transfers said latent image and forms an imprint mold having a concave and convex form;

an imprinting step, which imprints said concave and convex form onto a base substrate used for a magnetic recording medium by pressing said imprint mold against it; and a replica forming step, which removes said imprint mold and forms a replica having said concave and convex form; wherein:

in said recording velocity setting step, within said resist layer on said substrate, said recording velocity in the radial direction is set to be relatively faster in the sparse regions, in which the radial direction distribution of substantially-circular ring-shaped tracks where said latent image formation is performed is more sparse than said predetermined condition, than in the dense regions, in which the radial direction distribution of said substantially-circular ring-shaped tracks is more dense than said predetermined condition, and in said controlling step, the radial direction movement velocity of said substrate by said substrate velocity adjusting step is varied so that it is relatively faster in the sparse regions, in which the radial direction distribution of said substantially-circular ring-shaped tracks is more sparse than said predetermined condition, than in the dense regions, in which the radial direction distribution of said substantially-circular ring-shaped tracks is more dense than said predetermined condition.

* * * * *